United States Patent [19]

Jones et al.

[11] Patent Number: 5,996,091
[45] Date of Patent: *Nov. 30, 1999

[54] CPLD SERIAL PROGRAMMING WITH EXTRA READ REGISTER

[75] Inventors: Christopher W. Jones; David L. Johnson, both of Pleasanton, Calif.

[73] Assignee: Cypress Semiconductor Corp., San Jose, Calif.

[*] Notice: This patent is subject to a terminal disclaimer.

[21] Appl. No.: 08/911,313

[22] Filed: Aug. 19, 1997

Related U.S. Application Data

[63] Continuation of application No. 08/625,541, Mar. 28, 1997, Pat. No. 5,805,794.

[51] Int. Cl.⁶ ........................................... G06F 11/00
[52] U.S. Cl. .................. 714/37; 714/30; 714/725; 714/733; 714/734
[58] Field of Search .................. 395/183.13, 183.06, 395/183.07, 183.01; 371/22.31, 22.5, 22.6, 22.2, 22.1, 21.1, 21.2; 714/37, 30, 31, 25, 726, 733, 734, 724, 725, 718, 719

[56] References Cited

U.S. PATENT DOCUMENTS

| | | | |
|---|---|---|---|
| 3,831,148 | 8/1974 | Greenwald et al. | 395/183.07 |
| 4,734,852 | 3/1988 | Johnson et al. | 364/200 |
| 4,860,293 | 8/1989 | Engel et al. | 371/21.2 |
| 4,910,664 | 3/1990 | Arizono | 364/200 |
| 4,929,889 | 5/1990 | Seiler et al. | 371/22.3 |
| 5,103,450 | 4/1992 | Whetsel | 371/22.1 |
| 5,142,223 | 8/1992 | Higashino et al. | 371/22.1 |
| 5,195,097 | 3/1993 | Bogholtz, Jr. et al. | 371/22.1 |
| 5,258,986 | 11/1993 | Zerbe | 371/21.2 |
| 5,301,156 | 4/1994 | Talley | 371/22.3 |
| 5,311,520 | 5/1994 | Raghavachari | 371/21.2 |
| 5,381,419 | 1/1995 | Zorian | 371/21.1 |
| 5,396,170 | 3/1995 | D'Souza et al. | 371/22.3 |
| 5,404,526 | 4/1995 | Dosch et al. | 395/183.06 |
| 5,412,260 | 5/1995 | Tsui et al. | 371/22.3 |
| 5,444,716 | 8/1995 | Jarwala et al. | 371/22.3 |
| 5,519,715 | 5/1996 | Hao et al. | 371/22.3 |
| 5,557,619 | 9/1996 | Rapoport | 371/22.5 |
| 5,574,684 | 11/1996 | Tomoeda | 371/21.2 |
| 5,574,879 | 11/1996 | Wells et al. | 395/427 |
| 5,608,885 | 3/1997 | Gupta et al. | 395/380 |
| 5,805,794 | 9/1998 | Jones et al. | 395/183.13 |

*Primary Examiner*—Dieu-Minh T. Le
*Attorney, Agent, or Firm*—Blakley, Sokoloff, Taylor & Zafman LLP

[57] ABSTRACT

A method for programming or testing a CPLD using an additional read register. In one embodiment, the method comprises: instructing the CPLD in one instruction to load program data, load address information and program the program data into a memory location having an address defined by the address information; loading the program data into a first data storage element and the address information into an address storage element; programming the program data into the memory location; instructing the CPLD to read verify data from the memory location; and capturing the verify data into a second data storage element. The second data storage element comprising a read registers. The novel method further comprises comparing the verify data with the program data. The verify data and the program data may be compared within the CPLD or the verify data may be output from the CPLD and compared with the program data externally. The novel method further comprises instructing the CPLD to program again, or overprogram, the program data into the memory location if the program data matches the verify data. The novel method further comprises reprogramming the program data into the memory location if the program data does not match the verify data.

23 Claims, 26 Drawing Sheets

CPLD SERIAL PROGRAMMING WITH EXTRA READ REGISTER

CROSS-REFERENCE TO RELATED APPLICATIONS

This is a continuation of application Ser. No. 08/625,541, filed Mar. 28, 1997, now U.S. Pat. No. 5,805,794.

This application is related to subject matter in copending U.S. patent application Ser. No. 08/625,361 filed Mar, 28, 1996 1996 entitled "METHOD AND APPARATUS FOR SERIALLY PROGRAMMING A PROGRAMMABLE LOGIC DEVICE", U.S. patent application Ser. No. 08/623,423 filed Mar. 28, 1996 1996 entitled "FAST VERIFY METHOD AND APPARATUS FOR PROGRAMMING A PROGRAMMABLE LOGIC DEVICE", and U.S. patent application Ser. No. 08/624,193 filed Mar. 28, 1996 1996 entitled "CPLD SERIAL PROGRAMMING INSTRUCTION CODING". Each of the above referenced applications are assigned to the assignee of this application.

BACKGROUND OF THE INVENTION

1. Field of the Invention

The present invention relates to the field of programming and testing integrated circuits or systems.

2. Art Background

Various techniques have been developed to enable programming and testing of programmable elements (memory locations) of a programmable logic device (PLD) or complex programmable logic device (CPLD). Generally, programmable elements within CPLDs have been programmed by applying program data through a parallel interface of the CPLD. When a CPLD is programmed through a parallel interface, the data used for programming a memory location is provided on several device pins, and the data that is output during the verification of a memory location is also provided on several device pins. These device pins may or may not comprise the same device pins.

A typical flow diagram for programming every memory location with a desired pattern in a CPLD is illustrated in FIG. 1. The programming flow chart illustrated in FIG. 1 may be used, for example, in programming a CY7C371 CPLD manufactured by Cypress Semiconductor Corporation. At step 100, a power supply voltage is applied to the CPLD. Typically, the power supply voltage applied to the CPLD comprises +5.0 volts or +3.3 volts. At step 102, a programming voltage is applied to the CPLD. The programming voltage is typically an elevated voltage which is used to program the memory locations in the CPLD. A typical programming voltage comprises +12.0 volts. At step 104, the silicon identification for the particular CPLD under test is read from a memory location within the CPLD. The silicon identification is verified to match the CPLD device under test (e.g. CY7C371). At step 106, a program cycle counter is read and verified. The program cycle counter indicates the number of times the CPLD has been programmed. For quality and reliability purposes, at step 108, the program cycle counter is checked to determine if it contains a value greater than or equal to a predetermined number of programming attempts (e.g. 100 programming attempts). If the program cycle counter is greater than or equal to the predetermined number of programming attempts, the device is discarded at step 110. If the device has been programmed less than the predetermined number of times, program data is applied to the parallel interface of the CPLD and every memory location is programmed with a background pattern at step 112. Background programming ensures that every programmable memory location contained within the device is programmed, including main array bits, configuration bits, user identification bits, program cycle counter bits and a security bit. Every programmable element is programmed regardless of whether its present state is programmed or unprogrammed. This is done to provide for a consistent erasure of all of the memory locations. At step 114, all of the memory locations are erased. At step 116, the erasure of the memory locations is confirmed. Step 116 is referred to as the blank verify.

At step 118, a desired program pattern is programmed into the CPLD. FIG. 2 illustrates a general program flow chart for programming the desired pattern into the CPLD, and will be described in detail below. At step 120, the configuration bits of the CPLD are programmed again to boost or raise the overall margin. Configuration bits in a CPLD may comprise programmable locations that control the configuration of macrocells, a programmable interconnect matrix (PIM), or a product term matrix (PTM). At step 122, the program cycle counter is updated and verified. At step 124, all of the memory locations are read at power supply rails to verify that no disturb problems exist in the programming of the CPLD. Disturb problems cause unintentional programming of a memory location while programming another related location, such as a location on the same row or column. At step 126, a security bit of the CPLD is optionally programmed and verified. At step 128, the programming voltage is removed from the CPLD, that is, the programming voltage is forced to a non-programming voltage (e.g. ground). At step 130, the power supply voltage is removed from the CPLD and the programming flow stops.

FIG. 2 illustrates one example of parallel programming a desired pattern into a CPLD according to step 118 of FIG. 1. The programming flow starts at step 202. At step 204, a row address is loaded into a row address register. The row address indicates the row address of the memory location to be programmed. At step 206, a column address is loaded into a column address register. The column address indicates the column address of the memory location to be programmed. At step 208, program data is placed onto parallel interface data input pins. At step 210, a counter variable C is set to zero. The counter variable C indicates the number of attempts at programming a particular memory location. At step 212, the program flow checks to see if the counter variable has reached the maximum number of programming attempts allowed. In one example, C may comprise a maximum of four programming attempts. If C has reached the maximum number of programming attempts, the programming of the CPLD fails as indicated by step 214. If C has not reached the maximum number of programming attempts, the program flow programs data into a memory location at step 216. At step 218, C is incremented by one.

At step 220, programming of the memory location is immediately verified to determine if another attempt to program the same memory location is required. If the data read from the programmable memory location (verify data) does not match the program data, the program flow returns to step 212 and attempts to reprogram the memory location if C has not reached the maximum number of programming attempts. If the verify data matches the program data at step 220, the program data is programmed again into the memory location at step 222. The reprogramming of the program data at step 222 is termed "overprogramming." Overprogramming boosts the charge stored at a programmed memory location. At step 224, the program flow determines if the last column address of the programmable memory locations has been programmed. If it has not, the column address is updated and the program flow returns to step 206. If the last column address has been reached, the program flow determines if the last row address has been reached at step 226. If it has not, the row address is updated and the program flow returns to step 204. If the last row address has been reached, the program flow stops at step 228.

Parallel programming and verification of programming are not always possible or efficient. For example, when a CPLD has been affixed to a printed circuit board (PCB), it is expensive, time consuming, and often impractical to test an individual component by a parallel programming technique. Additionally, programming a device using a parallel programming interface requires the control of a significant number of pins. In many cases, as many as 25 to 30 pins must be controlled in a parallel programming interface. As a result, various techniques have been developed to enable testing of a CPLD using test logic having a serial programming interface. Program data to be provided to programmable memory locations of a CPLD are input through a serial input port. Verification data read from the programmable memory locations is read from a serial output port. The serial programming interface provides a more efficient interface for programming a device already soldered onto a PCB.

One type of serial programming interface is incorporated into the 22V10D Flash PLD designed by Cypress Semiconductor Corporation. The 22V10D includes a test circuit coupled to memory locations as generally illustrated in block diagram form in FIG. 3a. FIG. 3a shows a 22V10D Flash PLD 300 which includes programmable memory 304 coupled to parallel input data at node 318 and parallel output data at node 332. The 22V10D 300 incorporates a serial interface test circuit 303 which is not compatible with the IEEE 1149.1 (JTAG) specification described below, but is able to generally implement a serial program flow consistent with FIG. 1 and FIG. 2. Test circuit 303 comprises control logic 306 which controls the programming of memory 304. Control logic 306 receives control signals from the parallel data input, including a programming voltage at node 320, register select signals RSEL0 at node 322 and RSEL1 at node 324 which are used to select one of four shift registers, and a program pulse DO_IT at node 326. Additionally, control logic 306 receives a serial input clock SCLK at node 328. Test circuit 303 also includes four shift registers, namely: data shift register 310, column address shift register 312, row address shift register 314 and mode select shift register 316. The four shift registers receive serial input data from SDI at node 330 and the serial input clock SCLK at node 328.

With reference to FIG. 2, a row address for a memory location to be programmed in the 22V10D is serially shifted into row address shift register 314 at step 204, a column address is serially shifted into column address shift register 312 at step 206 and program data is serially shifted into data shift register 310 at step 208. The 22V10D must use the externally supplied register select signals RSEL0 and RSEL1 to determine which register is selected at a given time. In response to a program instruction loaded into mode select shift register 316, program data is programmed into a memory location at step 216 when a program pulse is applied on DO_IT at node 326. As a result of the programming step, the programmed data is immediately fast verified. Verify data is not loaded into the data shift register and then shifted out of the 22V10D to be compared against the program data. Instead, an internal comparison of the verify data and the program data is made by compare logic 308. The result of that comparison is output on one of the parallel data output pins at a predetermined amount of time following a program pulse on DO_IT at node 326. The result of the comparison is combinatorial in nature, that is, the result is not registered nor output on one of the parallel data outputs in response to a clock signal. As a result, one 22V10D cannot be cascaded with another 22V10D and continue to support the verify method described above.

The comparison of the verify data read from the memory location and the program data stored in the data shift register is accomplished by compare logic 308. Compare logic 308 is further illustrated in FIG. 3b, which shows exclusive OR (XOR) gate 380 comparing the data shift register bit zero (DR0) with the verify data bit zero. In like manner, each of the program data bits stored in the data shift register is compared against each of the corresponding verify bits read from a memory location. As illustrated in FIG. 3b, there are ten (10) program data bits (DR0–DR9) stored in the data shift register which are compared against ten (10) verify data bits by XOR gates 380 through 389. The outputs of XOR gates 380 through 389 are coupled to an inverted OR (NOR) gate 390. NOR gate 390 generates a fast verify output which comprises a high logic level when all of the program data bits match all of the corresponding verify data bits. NOR gate 390 generates a fast verify output which comprises a low logic level when one of the program data bits does not match a corresponding one of the verify data bits.

While program verification is performed by compare logic within the 22V10D, the 22V10D architecture suffers from a number of disadvantages. First, the 22V10D architecture is not compatible with the IEEE 1149.1 JTAG) four-pin specification (described below). Second, the only 22V10D instruction (mode) that has multiple functions is the program (DO_IT pulse)/fast verify instruction (mode). That is, the 22V10D does not receive an instruction which indicates that the 22V10D should load row, column or program data and then program the received data; rather, there is only one program instruction which programs data into a memory location and verifies the results in response to a program (DO_IT) pulse. The 22V10D shifting of the row address, column address, and data registers is always separate and never combined. The user must use the RSEL0 and RSEL1 external signals to control the loading of the various shift registers. Third, the 22V10D codes used for the instructions (modes) are not defined to allow partial shifting to accomplish the changing of one instruction into another instruction. Fourth, the program/fast verify instruction (mode) of the 22V10D only improves the time required to immediately verify a location after programming and then to overprogram, but the speed of the other operations are not improved. Fifth, as described above, the 22V10D combinatorial nature of the compare logic performing a fast verify function does not allow multiple devices to be cascaded together.

Additionally, the 22V10D architecture must compare each and every program data bit against each and every verify data bit. This is a significant disadvantage when considering two types of verification scenarios. In the first scenario, a memory location to be programmed does not comprise the same number of bits as the number of bits in the data shift register. Some memory locations are naturally better suited to be programmed in groups that are less than the size of the data shift register (e.g. programming the one-bit security bit). For example, the data shift register may comprise eight bits and a programmable location may only comprise six bits. Since each and every bit of the data shift register is compared against each and every bit of the verify data, data bits not used for programming in a given programming step would have to be preloaded with predetermined default values. This requires the user to know the default values ahead of time.

The second scenario involves "single-bit programming." Even though the programming of an entire byte of program data is supported by the 22V10D's programming interface, many times only one bit of a byte can be programmed at a time to achieve satisfactory programming. This may be due to the relatively close proximity of the bits of a byte to be programmed within the layout of a particular programmable device. Bits of a byte which must be programmed under the technique of single-bit programming are usually determined during characterization of the device rather than during design and fabrication. In single-bit programming, if n bits of a byte are to be programmed, the same addressed memory location must be programmed and verified with n different data patterns, each data pattern containing the data to program only one bit. The fast verify architecture of the 22V10D does not support single-bit programming. For example, if an eight bit data pattern to be programmed using single-bit programming comprises 00001010 (where a logic one indicates programming a bit in a memory location), the first single-bit programming data pattern to be loaded into the data shift register would comprise 00000010. In the immediately following verify function, the verify data would also comprise 00000010, and the verify function would generate a correct comparison result. The second single-bit programming data pattern to be loaded into the data shift register and programmed into the appropriate memory location would comprise 00001000. The verify data now read from the programmed memory location would now comprise 00001010. This bit pattern would be compared against 00001000 stored in the data shift register. Given that each and every bit of the program data is compared against each and every corresponding bit of the verify data, regardless of whether the program data comprises a logic one or a logic zero, the result of the fast verify would indicate a failure when there was no failure. Therefore, the fast verify architecture as utilized in the 22V10D does not support single-bit programming. Additionally, the 22V10D architecture does not support multi-bit programming. Multi-bit programming is an extension of single-bit programming in that no adjacent bits may be simultaneously programmed.

Therefore, what is needed is an improved method and apparatus for fast verifying the result of programming memory locations in a PLD, CPLD or other programmable device. Additionally, what is needed is an improved method and apparatus for fast verifying the result of programming memory locations in a CPLD which supports programming a memory location and immediately verifying the programming. When immediately verifying the programming, the data in the data register remains intact for reprogramming when the memory location does not verify, or for overprogramming when the memory location does verify. Additionally, what is needed is an improved method and apparatus for fast verifying the result of programming memory locations in a CPLD which utilizes a register. Additionally, what is needed is an improved method and apparatus for fast verifying the result of programming memory locations in a CPLD which supports the cascading of serial test circuits and propagating the fast verify result through the serial test circuits. Additionally, what is needed is an improved method and apparatus for fast verifying the result of programming memory locations in a CPLD which supports single-bit programming or multi-bit programming.

Additionally, what is needed is an improved method and apparatus for fast verifying the result of programming memory locations in a CPLD which compares only those bits programmed into a memory location with verify data read from the memory location. Additionally, what is needed is an improved method and apparatus for fast verifying the result of programming memory locations in a CPLD which fills in the bits of a data register with appropriate logic states without the user having to know what default states to load into the data register where there is not a corresponding bit in the memory location, thus excluding those bits from the fast verify comparison.

Another approach to providing a serial programming interface in a device under test is defined in IEEE Std 1149.1-1990 and 1149.1a-1993 entitled IEEE Standard Test Access Port and Boundary-Scan Architecture (IEEE Std 1149.1), ISBN 1-55937-350-4, which is commonly referred to as the JTAG (Joint Test Access Group) specification. The JTAG specification defines a test access port (TAP) which is a general purpose port that can provide access to any test support functions built into a component to be tested. The TAP has a minimum of three dedicated input connections: a Test Input Clock (TCK) for clocking in serial test data or instruction information, a Test Mode Select Input (TMS) which is decoded by logic accessing the TAP to control test operations, and Test Data Input (TDI) which provides serial input test data, address information, or instruction information. In addition, the TAP has, at a minimum, one dedicated output: Test Data Output (TDO) which provides for the serial output of data from the TAP. Through the use of the test logic accessed through the TAP, data, address and instruction information may be serially written to and read from a device under test.

FIG. 4a shows a single device under test 400 in which test logic accessed through a TAP may be implemented. Device under test 400 may be a single integrated circuit device or a system on a PCB. Device under test 400 may comprise, for example, a CPLD. Device under test 400 includes a memory 402 comprising programmable memory locations coupled to test circuit 404 via bus 418. Memory 402 receives parallel input data at node 406 and provides parallel output data at node 408. Test circuit 404 receives serial input test data, address data and instruction information from TDI at node 410. Test circuit 404 also receives test input clock TCK at node 412, and test mode select input TMS at node 414. Additionally, test circuit 404 serially outputs TDO at node 416.

FIG. 4b shows a multiple device under test configuration illustrating how components may be cascaded together in a serial fashion in compliance with the JTAG specification. Specifically, device under test 430 is serially coupled to device under test 446 through their respective test circuits 434 and 450. When test circuits 434 and 450 comprise test logic accessed through a TAP, as illustrated in FIG. 4a, test circuits 434 and 450 receive TCK 438 and TMS 440. Test data, address data and instruction information is serially received by test circuit 434 from TDI at node 436 and may be coupled to test circuit 450 via node 442. Test circuit 450 outputs the test data, address data and instruction information at node 452. Test circuits 434 and 450 may be distributed throughout device under test 430 and device under test 446.

FIG. 5 illustrates prior art test logic 500 which operates in accordance with the JTAG specification. Test logic 500 is coupled to memory 528. Memory 528 comprises memory locations in a programmable logic device under test. Test logic 500 comprises controller 503 which includes control logic 502 coupled to decode logic 504. Control logic 502 receives and interprets the signals on TMS at node 518 and TCK at node 520. Control logic 502 and decode logic 504 generate clock and/or control signals as required by test logic 500. A set of registers, including instruction register 506, data register 508, address register 510, boundary scan register 512 and bypass register 514, is configured to receive input signals from decode control logic 504, TCK and TDI.

Through the interaction of control logic 502 and decode logic 504 an instruction is serially loaded into instruction register 506 from TDI. Instructions loaded into instruction register 506 are decoded by decode logic 504 and are used to select a test to be performed and/or register to be accessed. Data register 508 stores program data to be programmed into memory 528 and verify data read from memory 528. Address register 510 stores the address location of the memory location to be accessed in memory 528.

Test logic 500 additionally includes a selector or multiplexer 516 coupled to select signal 526. Selector 516 receives serial data shifted out from data register 508, address register 510, instruction register 506, boundary scan register 512 and bypass register 514. Control logic 502 and decode logic 504 control select signal 526 which selectively enables one of the serial inputs coupled to selector 516 to be serially output at TDO at node 524.

FIG. 6 shows a TAP controller state diagram 600 that is included in the JTAG specification. All test circuitry compliant with the JTAG specification must implement the TAP controller state diagram including states 602 through 632. The TAP controller state diagram would be implemented by controller 503 illustrated in FIG. 5. The TAP controller state diagram is synchronized to the TCK input and is controlled by the TMS input.

FIGS. 7–10 illustrate conventional methods of serially programming a CPLD according to the program flow charts of FIGS. 1 and 2 and using the JTAG compatible test circuit illustrated in FIG. 5. The programming methods illustrated in FIGS. 7–10 are implemented using the TAP controller state diagram illustrated in FIG. 6. Throughout the discussion of FIGS. 7–10, reference will be made to the number of clock cycles that is required to complete a given operation. It will be appreciated that the following discussion generally excludes the calculation of the clock cycles that are required to move from one state to another state in the TAP controller state diagram. These transition clock cycles are generally excluded from the discussion in order to not obscure the general operation of the program flow charts. Additionally, instruction register 506 comprises Z bits, address register 510 comprises Y bits and data register 508 comprises X bits. Therefore, it requires Z clock cycles to shift an instruction into instruction register 506, Y clock cycles to shift address information into address register 510 and X clock cycles to shift program data into data register 508.

FIG. 7 illustrates a conventional method for reading verify data from a memory location in a CPLD using the serial programming interface test circuitry of FIG. 5. The verify data may be compared against an expected result external to the CPLD. The program flow illustrated in FIG. 7 may be used for a number of read steps illustrated in FIG. 1, including: reading or verifying a single memory location such as step 104; reading and verifying multiple locations; and reading and verifying the entire CPLD such as steps 116 and 124. The program flow starts at step 702. At step 704, an instruction is shifted into instruction register 506 which indicates that address information will be shifted into address register (AR) 510. At step 706, the address information is shifted into address register 510. At step 708, an instruction is shifted into instruction register 506 which indicates that verify data is to be read from the memory location addressed by the address information stored in address register 510. At step 710, verify data is captured or read into data register (BR) 508. At step 712, the verify data is shifted out of data register 508 to serial output TDO. Step 714 determines if another memory location within the device is be read. If another memory location is to be read, the program flow returns to step 704. If another memory location is not to be read, the program flow stops at step 716. The program flow illustrated in FIG. 7, requires at least 2Z+Y+X clock cycles to read verify data from one memory location. Reading verify data from subsequent memory locations also requires 2Z+Y+X clock cycles.

FIG. 8 illustrates a conventional method for programming a memory location in a CPLD using the serial programming interface test circuitry of FIG. 5. The program flow illustrated in FIG. 8 may be used for step 120 illustrated in FIG. 1. The program flow starts at step 802. At step 804, an instruction is shifted into instruction register 506 which indicates that address information will be shifted into address register 510. At step 806, address information is shifted into address register 510. At step 808, an instruction is shifted into instruction register 506 which indicates that program data will be shifted into data register 508. At step 810, program data is shifted into data register 508. At step 812, an instruction is shifted into instruction register 506 which indicates that the program data in data register 508 will be programmed into a memory location having the address stored in address register 506. At step 814, the program data is programmed into the memory location. Step 816 determines if another memory location is be to programmed. If another memory location is to be programmed, the program flow returns to step 804. If another memory location is not to be programmed, the program flow stops at step 818. The program flow illustrated in FIG. 8 requires at least 3Z+Y+X clock cycles to program one memory location. Programming subsequent memory locations also requires 3Z+Y+X clock cycles.

FIG. 9 illustrates a conventional method for programming a background pattern into all of the memory locations in a CPLD using the serial programming interface test circuitry of FIG. 5. The program flow illustrated in FIG. 9 may be used for step 112 illustrated in FIG. 1. The program flow starts at step 902. At step 904, an instruction is shifted into instruction register 506 which indicates that program data will be loaded into data register 508. At step 906, program data is shifted into data register 508. At step 908, an instruction is loaded into instruction register 506 which indicates that address information will be loaded into address register 510. At step 910, address information is shifted into address register 510. At step 912, an instruction is shifted into instruction register 506 which indicates that the program data in data register 508 will be programmed into a memory location having the address stored in address register 506. At step 914, the program data is programmed into the memory location. Step 916 determines if another memory location is be to programmed. If another memory location is to be programmed, the program flow returns to step 908. If another memory location is not to be programmed, the program flow stops at step 918. The program flow illustrated in FIG. 9 requires at least 3Z+Y+X clock cycles to program at least one memory location. Programming of subsequent locations requires at least 2Z+Y clock cycles.

FIG. 10 illustrates a conventional method for programming a desired pattern into a CPLD, immediately verifying the programming, and overprogramming the desired pattern. The program flow illustrated in FIG. 10 corresponds to the program flow illustrated in FIG. 2 using the serial programming interface test circuitry of FIG. 5. The program flow starts at step 1002. At step 1004, an instruction is loaded into instruction register 506 indicating that address information will be loaded into address register (AR) 510. At step 1006, address information is shifted into address register 510. At step 1008, C is initialized to zero. At step 1010, the program flow checks to see if C equals the maximum number of programming attempts allowed. In C has reached the maximum number of programming attempts, the programming of the CPLD fails at step 1012. If C has not reached the maximum number of programming attempts allowed, the program flow shifts an instruction into instruction register 506 at step 1014 which indicates that program data will be loaded into data register 508 (BR). At step 1016, program data is shifted into data register 508. At step 1018, an instruction is shifted into instruction register 506 which indicates that program data in data register 508 will be programmed into a memory location having the address stored in address register 510. At step 1020, the program data is programmed into the memory location.

At steps 1022 through 1028, the programming of the memory location is immediately verified to determine if another attempt to program the same memory location is required. At step 1022, an instruction is loaded into instruction register 506 which indicates that verify data will be read from the programmed memory location. At step 1024, the verify data is read or captured into data register 508. At step 1026, the verify data is shifted out of data register 508 to serial output TDO. At step 1028, the verify data is externally compared against the programmed data. If the verify data does not match the program data, the program flow increments C at step 1029 and returns to step 1010. If the verify data matches the program data, the program flow overprograms the program data into the same memory location at steps 1030 through 1036. At step 1030, an instruction is shifted into instruction register 506 which indicates that the program data will be reloaded into data register 508. At step 1032, the program data is reshifted into data register 508. At step 1034, an instruction is shifted into instruction register 506 which indicates that the reloaded program data will be overprogrammed into the memory location. At step 1036, the program data is overprogrammed into the memory location. At step 1038, the program flow determines if another memory location needs to be programmed in accordance with the desired program pattern. If another memory location is to be programmed, the program flow returns to step 1004. If no other memory locations are to be programmed, the program flow stops at step 1040. The program flow illustrated in FIG. 10 requires at least 6Z+Y+3X clock cycles to program, verify and overprogram one memory location.

An alternative program flow based on FIG. 10 shifts the original program data into data register 508 at the same time the captured verify data is being shifted out of data register 508 at step 1026. This alternative obviates the need for steps 1030 and 1032 reducing the number of clock cycles required to program, verify and overprogram one memory location to at least 5Z+Y+2X clock cycles. Additionally, the number of cycles required to reprogram a memory location after the first memory location did not verify requires at least 2Z+X clck cycles (steps 1014 and 1016 are then not required for reprogramming).

The programming methods illustrated in FIGS. 7–10 require a significant number of clock cycles to program a memory location in a device under test, to verify the programming, and to reprogram or overprogram the memory location. The more clock cycles that are required to test a device, the lower the testing throughput and the greater the likelihood that a false programming error will be introduced due to system noise.

Therefore, a need exists for a method of programming and testing a device which reduces the number of method steps, instructions and clock cycles over the conventional methods illustrated in FIGS. 7–10. Additionally, a need exists for implementing such a method using test circuitry which is compatible with the JTAG specification. Additionally, a need exists for a method of programming and testing a device which uses multi-purpose instructions which define both programming and shifting operations in order to reduce the number of required method steps, instructions and clock cycles. Additionally a need exists for instruction codes which allow partial shifting to accomplish the changing of one instruction into another instruction in a number of clock cycles which is less than the number of clock cycles required to completely load every bit of an instruction register.

SUMMARY OF THE INVENTION

A novel method for programming or testing a CPLD using an additional read register is disclosed. In one embodiment, the method comprises: instructing the CPLD in one instruction to load program data, load address information and program the program data into a memory location having an address defined by the address information; loading the program data into a first data storage element and the address information into an address storage element; programming the program data into the memory location; instructing the CPLD to read verify data from the memory location; and capturing the verify data into a second data storage element. The second data storage element comprising a read register. The novel method further comprises comparing the verify data with the program data. The verify data and the program data may be compared within the CPLD or the verify data may be output from the CPLD and compared with the program data externally. The novel method further comprises instructing the CPLD to program again, or overprogram, the program data into the memory location if the program data matches the verify data. The novel method further comprises reprogramming the program data into the memory location if the program data does not match the verify data.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown.

FIG. 3b illustrates prior art compare logic for the 22V10D of FIG. 3a.

DETAILED DESCRIPTION

A fast verify method and apparatus for programming a programmable logic device is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily. It will be appreciated that the term "data" used throughout this application encompasses both the singular "datum" and the plural "data". Additionally, the novel methods and apparatus described in this application are described in relation to the JTAG specification. However, it will be appreciated by one skilled in the art that the novel methods and apparatus described herein may be implemented in devices or systems which incorporate test logic utilizing other standardized or non-standardized test logic. In addition, the term "device" is used throughout this specification to refer to any type of device, including an integrated circuit device, system, programmable logic device (PLD), or complex programmable logic device (CPLD). Also, throughout this application, data is serially shifted into and out of various register elements in accordance with a serial programming interface test circuit. It will be appreciated that the present invention may also be extended to encompass the parallel loading and unloading of register elements using a parallel programming interface of a test circuit.

Additionally, the novel methods are described in reference to the TAP controller state diagram of the JTAG specification. It will be appreciated that other state diagrams may be utilized for implementation of the novel methods described herein. It will be appreciated that when the novel methods are implemented in a manner compatible with the JTAG specification TAP controller state diagram, there are clock cycles required to move from one state to another. These clock cycles are not highlighted in this application; however, it will be appreciated that the novel methods described herein additionally reduce the number of state transitions in the TAP controller state diagram, thus, further reducing the number of clock cycles required over prior art methods of testing a device using JTAG compatible circuitry.

Figure 4A:
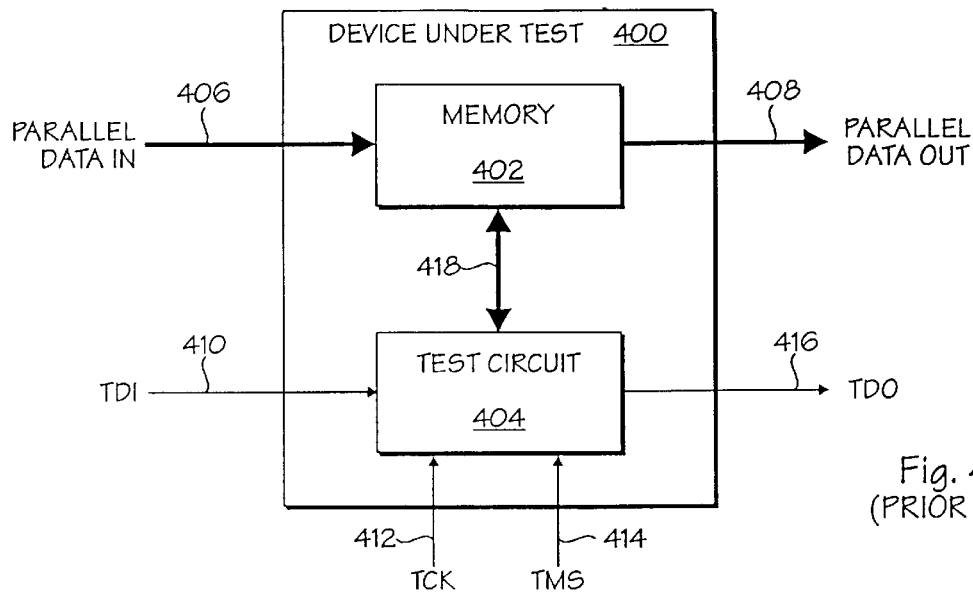
FIG. 4a illustrates a prior art device under test including a serial test circuit compatible with the IEEE 1149.1 (JTAG) specification.
Figure 4B:
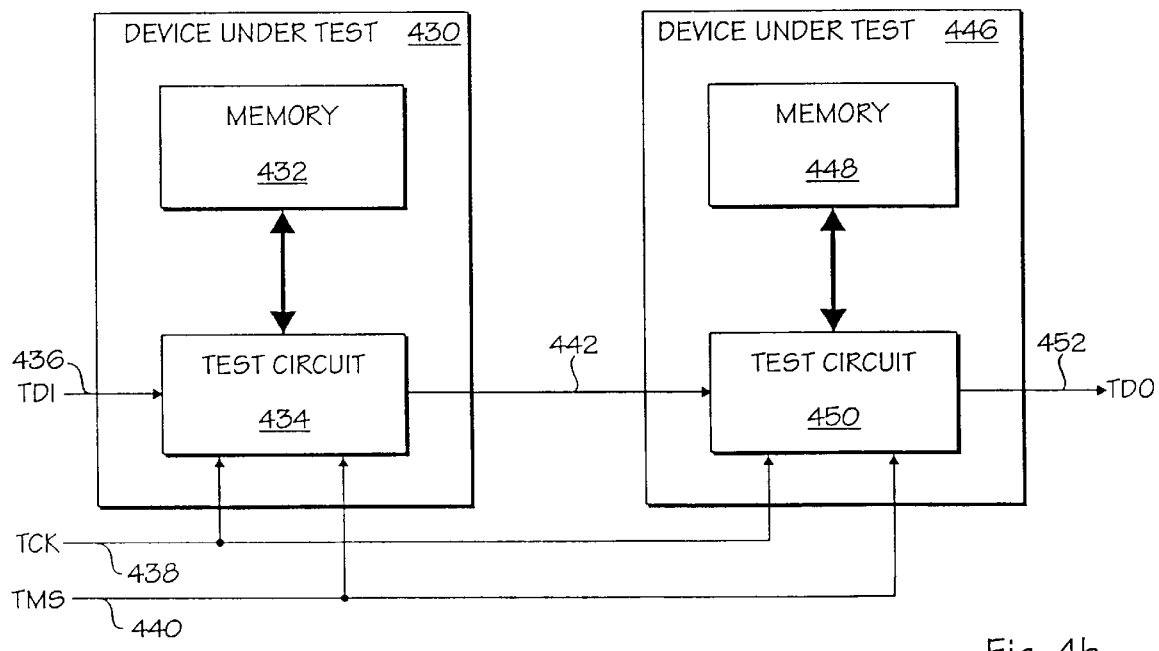
FIG. 4b illustrates a prior art configuration of cascading the serial test circuits of multiple devices.
Figure 6:
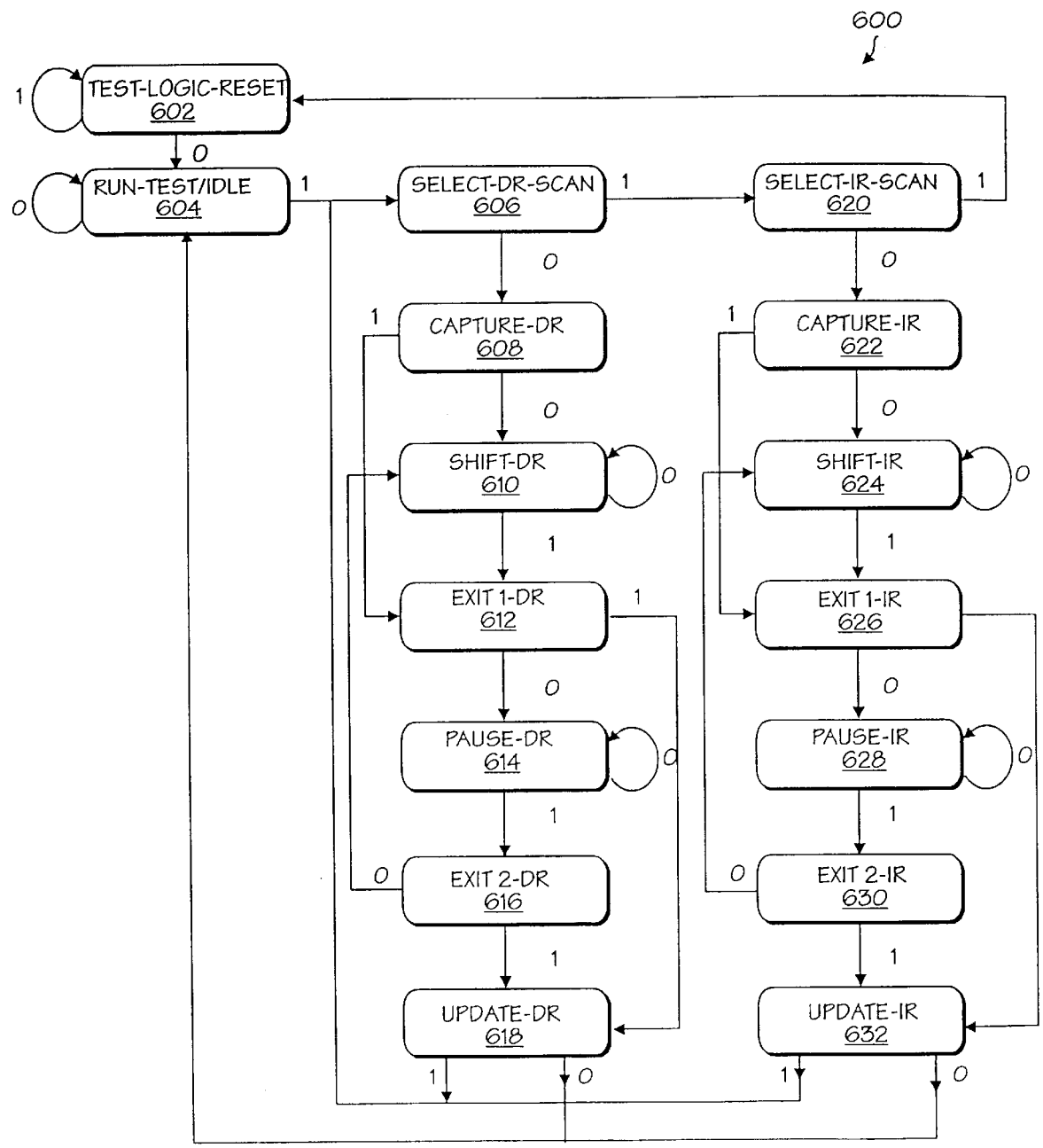
FIG. 6 illustrates a prior art state diagram of a TAP controller.
Figure 7:
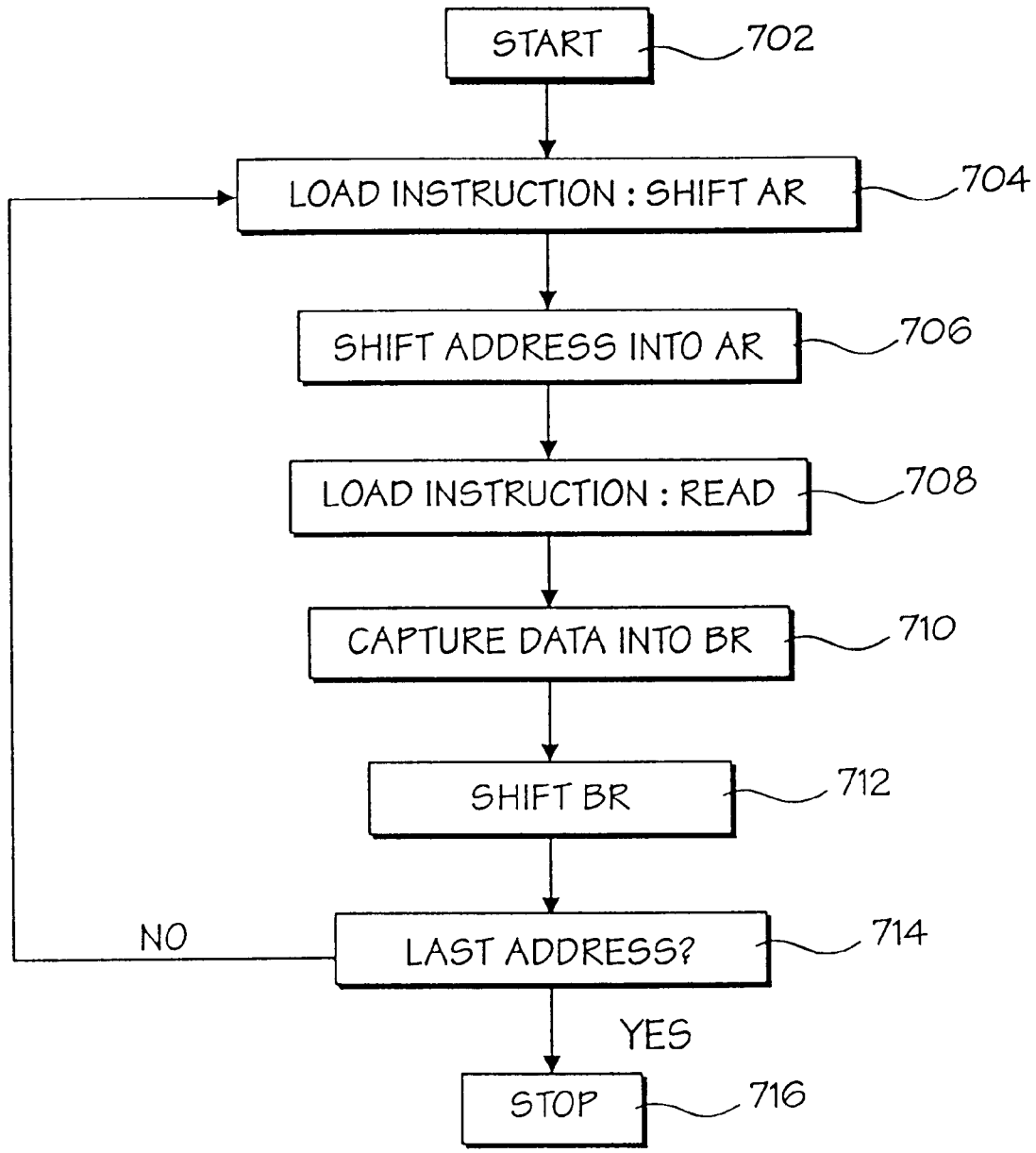
FIG. 7 illustrates a prior art method of reading verify data from a memory location using the test circuit of FIG. 5.
Figure 8:
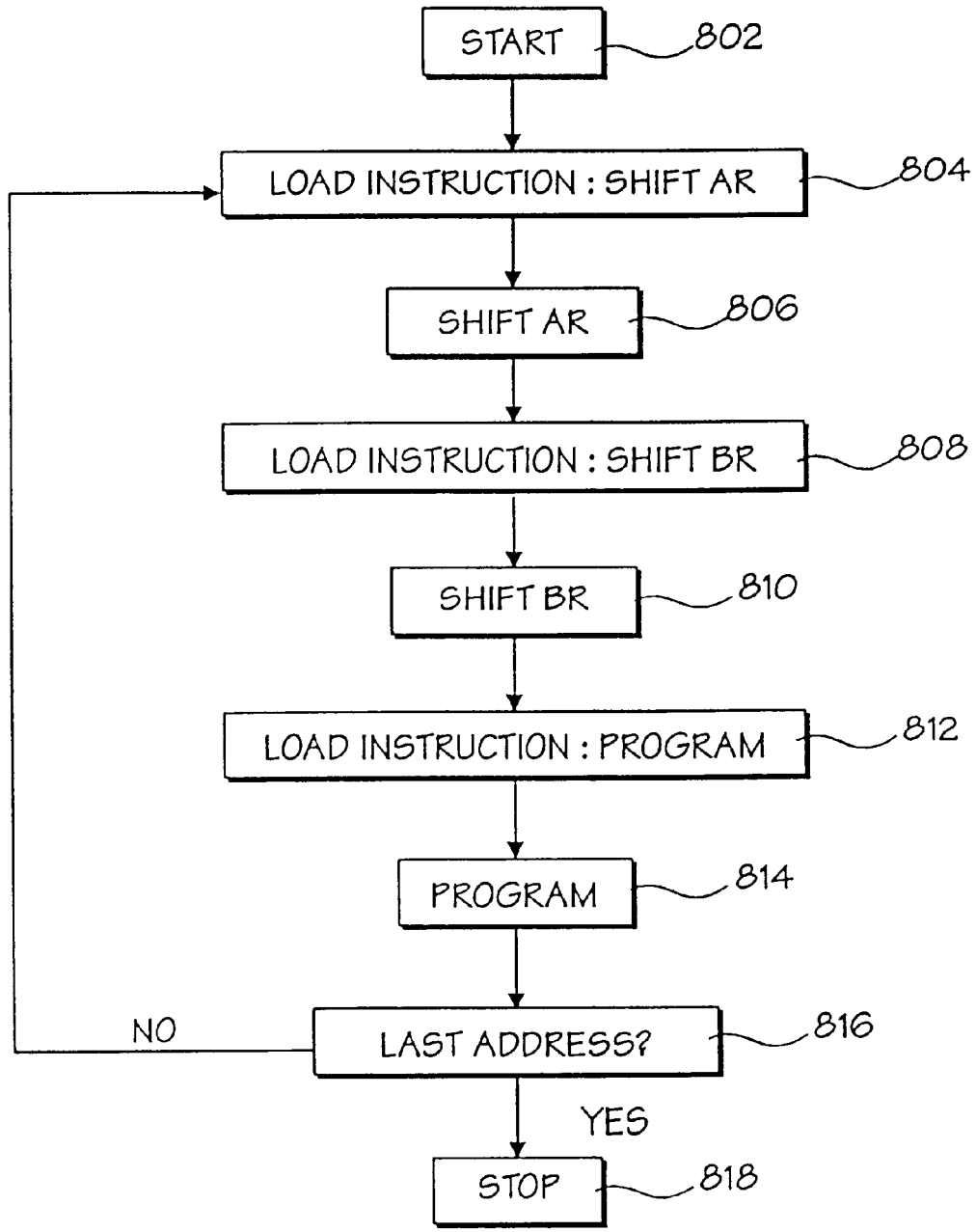
FIG. 8 illustrates a prior art method of programming a memory location using the test circuit of FIG. 5.
Figure 9:
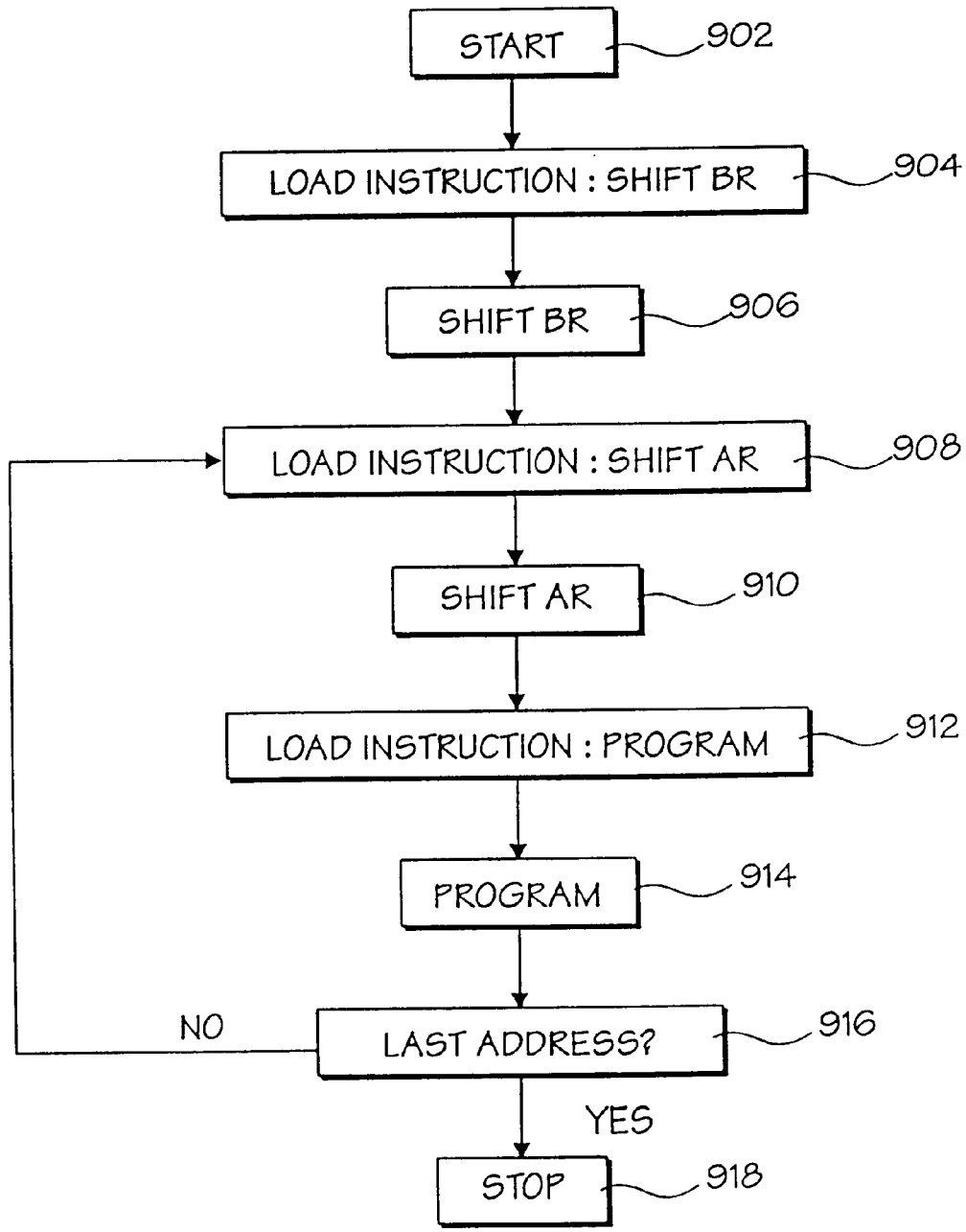
FIG. 9 illustrates a prior art method of background programming a programmable device using the test circuit of FIG. 5.
Figure 11:
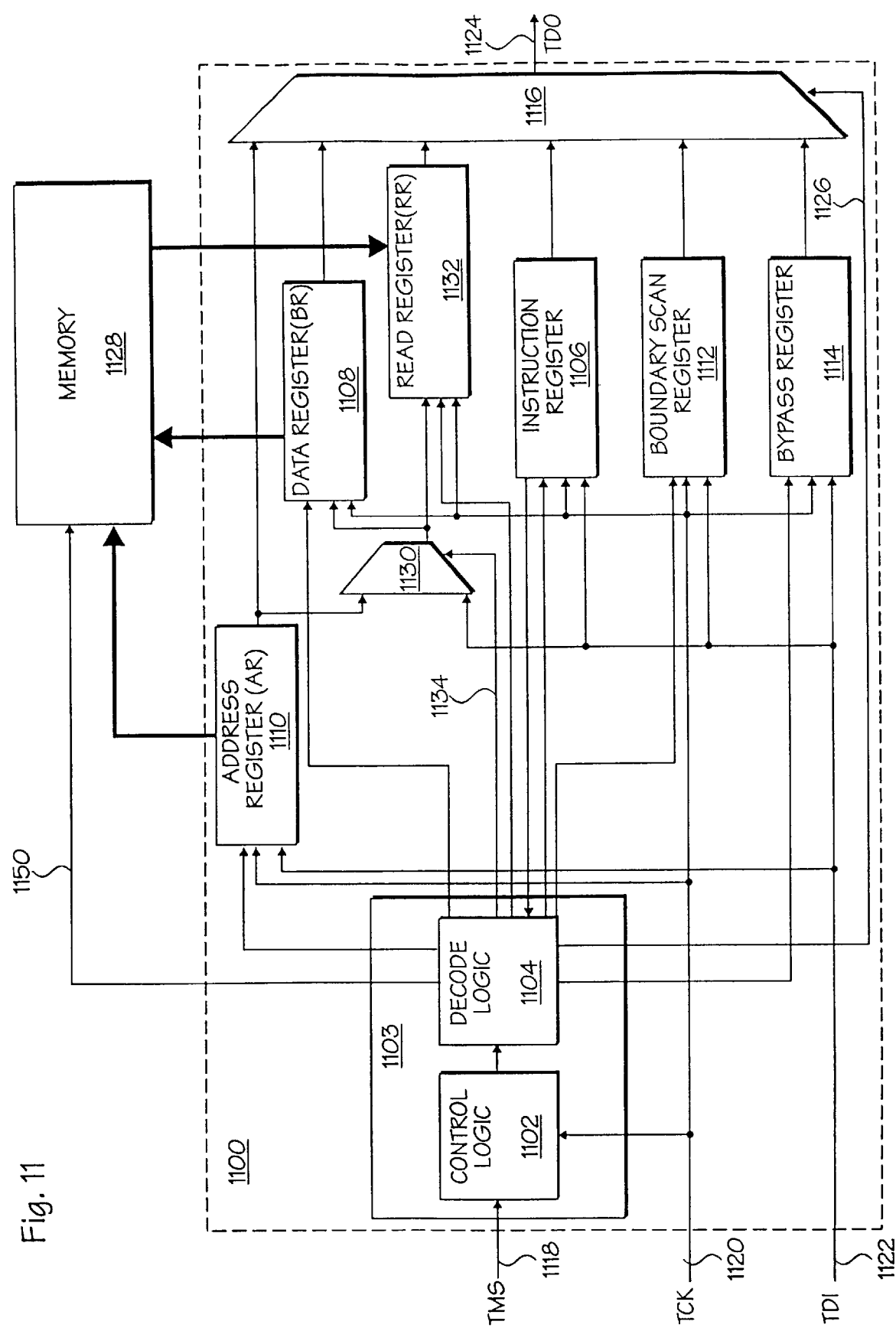
FIG. 11 illustrates a test circuit for implementing a method of programming a programmable device according to the present invention.

In one embodiment of the present invention, a method for programming a device, including a programmable logic device (PLD) or complex programmable logic device (CPLD) is described which may be implemented in the test circuit illustrated in FIG. 11. FIG. 11 illustrates a test circuit 1100 which may be implemented in a device under test, as illustrated in FIG. 4a, or in a plurality of devices under test cascaded together in a serial configuration as illustrated in FIG. 4b. Test circuit 1100 is compatible with the JTAG specification and uses the TAP controller state diagram illustrated in FIG. 6. Test circuit 1100 may be adjusted, in a manner known by those skilled in the art, to be compatible with other test standards or architectures.

Test logic 1100 is coupled to memory 1128. Memory 1128 comprises memory locations in a programmable logic device under test. Test circuit 1100 includes a controller 1103 which comprises control logic 1102 and decode logic 1104. Control logic 1102 receives and interprets the signals on TMS at node 1118 and TCK at node 1120. Together with decode logic 1104, control logic 1102 generates clock and/or control signals as required by test circuit 1100. It will be appreciated that control logic 1102 and decode control logic 1104 may be integrated into one functional block to perform the functions necessitated by controller 1103. Test logic 1100 further includes instruction register 1106, data register 1108, read register 1132, address register 1110, boundary scan register 1112 and bypass register 1114. Other registers may be included in test logic 1100 (e.g. a device identification register or other user-defined registers). It will be appreciated that bypass register 1114 and boundary scan register 1112 are not required in order to practice the present invention.

Each register is configured to receive input signals from decode control logic 1104, TCK and TDI. Each register is loaded and unloaded in a serial fashion by receiving serial input data from TDI and providing serial output data at TDO. Address register 1110 receives and stores address information from TDI and comprises a 14 bit register. It will be appreciated that address register 1110 may comprise any number of bits. The address information comprises an address location of a programmable memory location in memory 1128 to be programmed, verified, or read. Memory 1128 may comprise any programmable memory location in a device under test, including an integrated circuit device, system, programmable logic device (PLD) or complex programmable logic device (CPLD). A programmable memory location may include an SRAM cell, FLASH cell, fuse, anti-fuse, etc. Instruction register 1106 receives and stores instructions from TDI. Decode logic 1104 decodes the instructions, and together with control logic 1102, causes controller 1103 to perform a specific function. Instruction register 1106 comprises a 4-bit register. It will be appreciated that instruction register 1106 may comprise any number of bits. Data register 1108 receives program data from either TDI or address register 1110 via multiplexer 1130. The program data is provided to memory 1128. Verify data read from a programmable memory location in memory 1128 may alternatively be stored in data register 1108. Data register 1108 comprises an 8-bit register or one byte of data (a byte register). It will be appreciated that data register 1108 may comprise any number of bits. Read register 1132 receives data from TDI or address register 1110 via multiplexer 1130. Additionally, read register 1132 receives and stores verify data read from a programmable memory location in memory 1128. Read register may also alternatively be used to provide data to a programmable memory locations in memory 1128. Read register 1132 comprises an 8-bit register or one byte of verify data. It will be appreciated that read register 1132 may comprise any number of bits. Decode logic 1104 provides control signals to memory 1128 at node 1150 which may function, for example, as read or write control signals.

Additionally, test logic 1100 includes selector (multiplexer) 1116 and multiplexer 1130. Selector 1116 receives data serially shifted out from data register 1108, read register 1132, address register 1110, instruction register 1106, boundary scan register 1112 and bypass register 1114. In response to a select signal at node 1126, selector 1116 selectively couples the serial data received from one of the various registers to TDO at node 1124. Selector 1116 may comprise, for example, a 6-to-1 multiplexer. Multiplexer 1130 selectively provides TDI or the output of address register 1110 to data register 1108 or read register 1132 in response to a select signal at node 1134.

Figure 1:
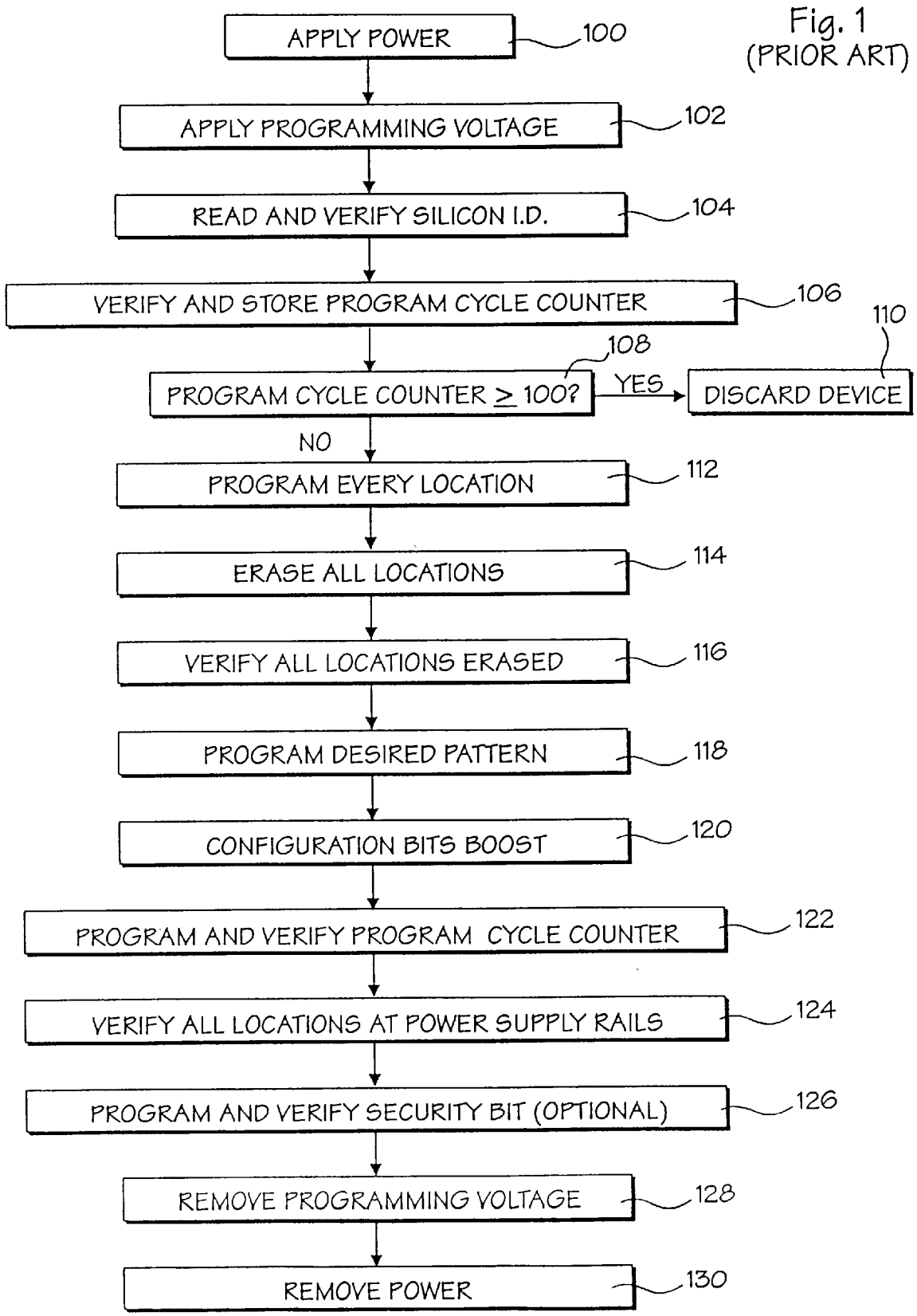
FIG. 1 illustrates a prior art method of programming a programmable logic device.
Figure 2:
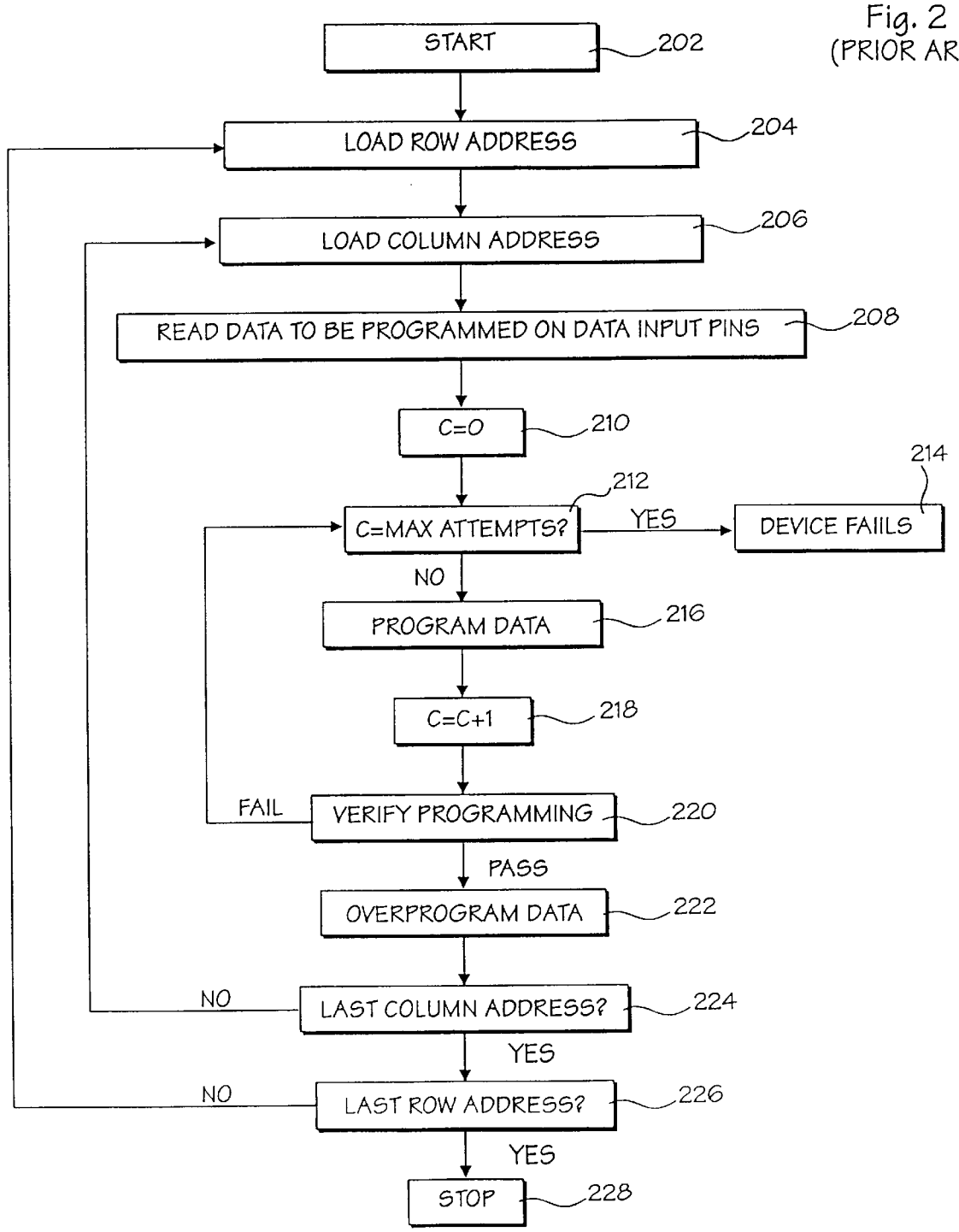
FIG. 2 illustrates a prior art method for programming a desired pattern in a programmable logic device.
Figure 3A:
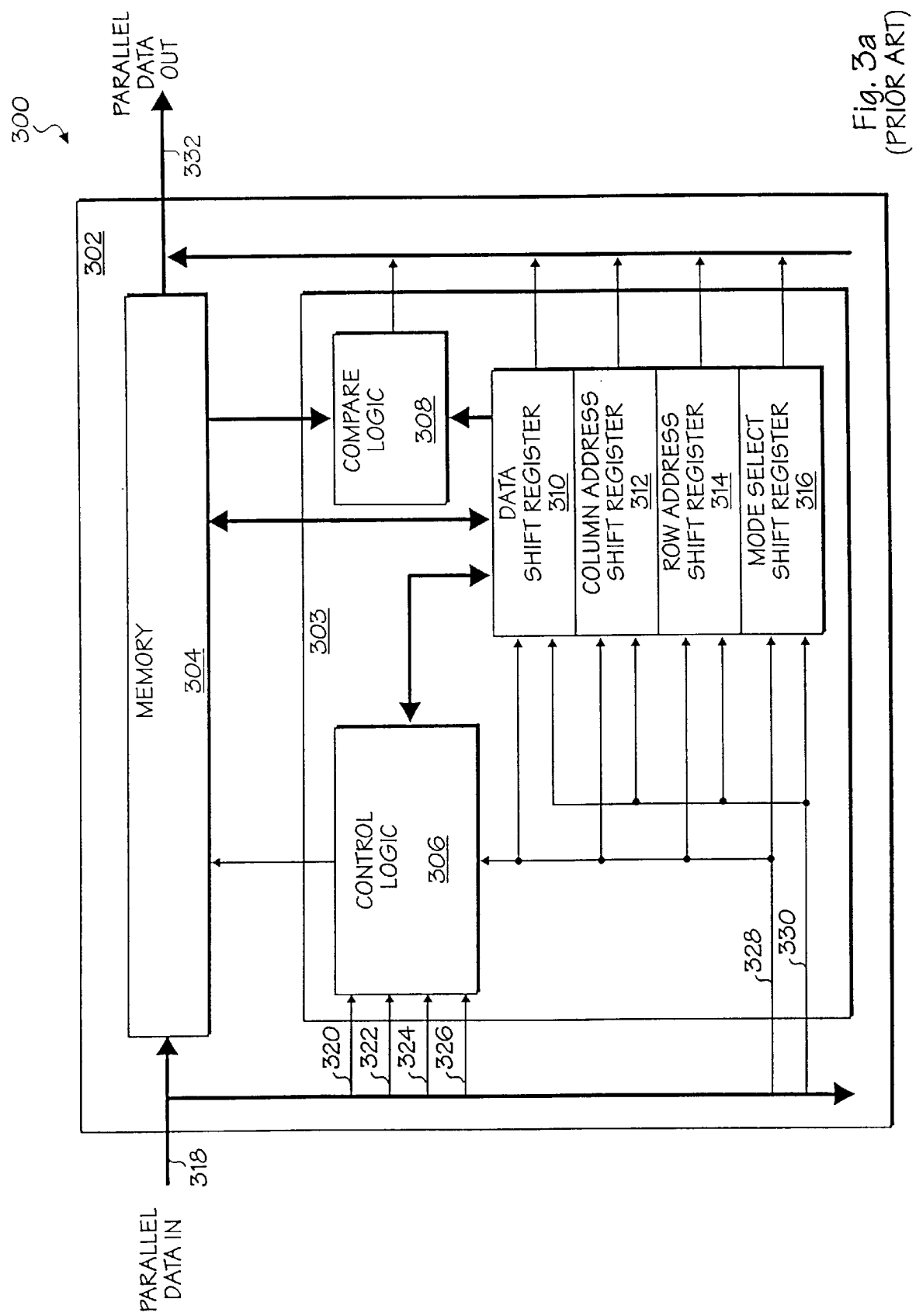
FIG. 3a illustrates a prior art block diagram of a 22V10D programmable logic device.
Figure 3B:
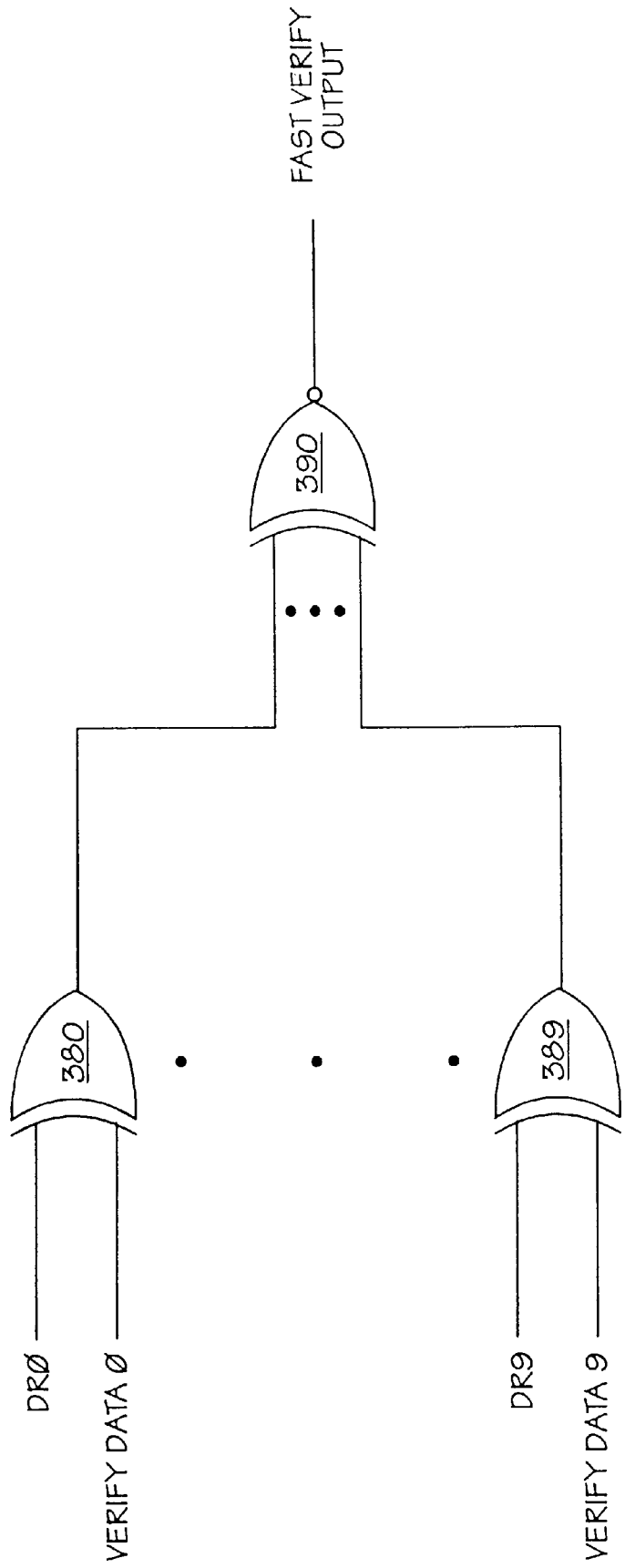
Figure 12:
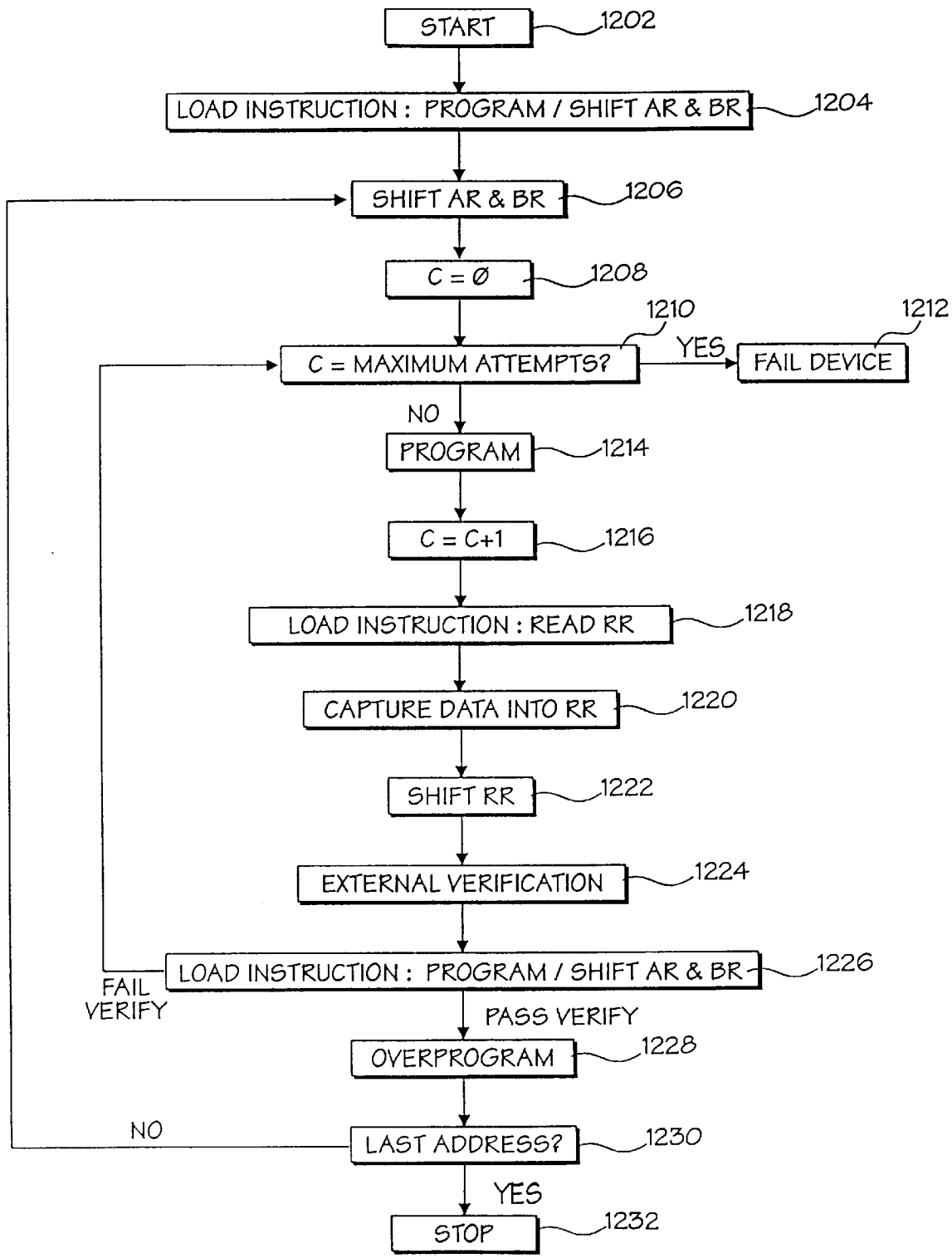
FIG. 12 illustrates one embodiment, according to the present invention, of a method for programming a programmable device using the test circuit of FIG. 11.

FIG. 12 illustrates a novel method for testing a device using test circuit 1100 and the program flow charts illustrated in FIG. 1 and FIG. 2. In particular, FIG. 12 illustrates an improved method which significantly reduces the number of instructions and clock cycles over prior art methods for programming, verifying and overprogramming or reprogramming a desired pattern into memory 1128. The reduction in instructions and clock cycles required to implement the method illustrated in FIG. 12 increases testing throughput, reduces test time and reduces the likelihood of false errors. FIG. 12 uses a new type of instruction, namely: program/shift AR & BR. This instruction enables test circuit 1100 to perform more than one type of function without loading a new instruction. With reference to the TAP controller state diagram illustrated in FIG. 6, when controller 1103 is in Run-Test-Idle state 604, the programmable memory location addressed by the contents of address register (AR) 1110 is programmed based upon the program data contained in data register (BR) 1108. When controller 1103 is in Shift-DR state 610, the concatenation of address register 1110 and data register 1108 is selected for shifting data from TDI to TDO.

With reference to FIG. 12, the program flow starts at step 1202. At step 1204, the program/shift AR & BR instruction is shifted into instruction register 1106 which instructs test circuit 1100, in one instruction, to shift program data into data register 1108, shift address information into address register 1110 and to program the program data into a programmable memory location in memory 1128. The programmable memory location in memory 1128 to be programmed is defined by the address information to be loaded into address register 1110. At step 1206, the program data is shifted into data register 1108, and the address information is shifted into address register 1110. Decode logic 1104 decodes the instruction in instruction register 1106 and provides the appropriate voltage level on the select signal at node 1134 to cause the concatenation of address register 1110 and data register 1108. Thus, program data will be shifted through address register 1110 and multiplexer 1130 before being shifted into data register 1108.

At step 1208, counter variable C is initialized to zero. At step 1210, the program flow determines if C equals the maximum number of programming attempts allowed. In C has reached the maximum number of programming attempts, the programming of the CPLD fails at step 1212. If C has not reached the maximum number of programming attempts allowed, the program flow programs the program data in data register 1108 into the addressed memory location in memory 1128. No additional instruction is required to be loaded into instruction register 1106 indicating that the memory location in memory 1128 should be programmed. At step 1216, C is incremented due to the programming at step 1214.

At steps 1218 through 1224, the programming of the memory location is immediately verified to determine if another attempt to program the same memory location is required. At step 1218, an instruction is shifted into instruction register 1106 instructing test circuit 1100 to read verify data from the programmed memory location, and to store the verify data into read register 1132 (RR). At step 1220, verify data is read or captured into read register 1132. At step 1222, the verify data is shifted out of read register 1132 to serial output TDO. At step 1224, the verify data is externally compared against the programmed data. At step 1226, the program/shift AR & BR instruction is shifted into instruction register 1106. If the verify data does not match the program data, the program flow returns to step 1210. If the verify data matches the program data, the program flow overprograms, or programs again, the program data still stored in data register 1108 into the same memory location at step 1228. At step 1230, the program flow determines if another memory location needs to be programmed in accordance with the desired program pattern. If another memory location is to be programmed, the address information and/or the program data is updated and the program flow returns to step 1206. If another memory location is not to be programmed, the program flow stops at step 1232.

In an alternative embodiment, a simple program instruction may be shifted into instruction register 1106 at step 1226. In this alternative embodiment, if another memory location is to be programmed, as determined at step 1230, the program flow will update the address information and/or program data and return to step 1204. If no other memory locations are to be programmed, the program flow stops at step 1232.

Figure 10:
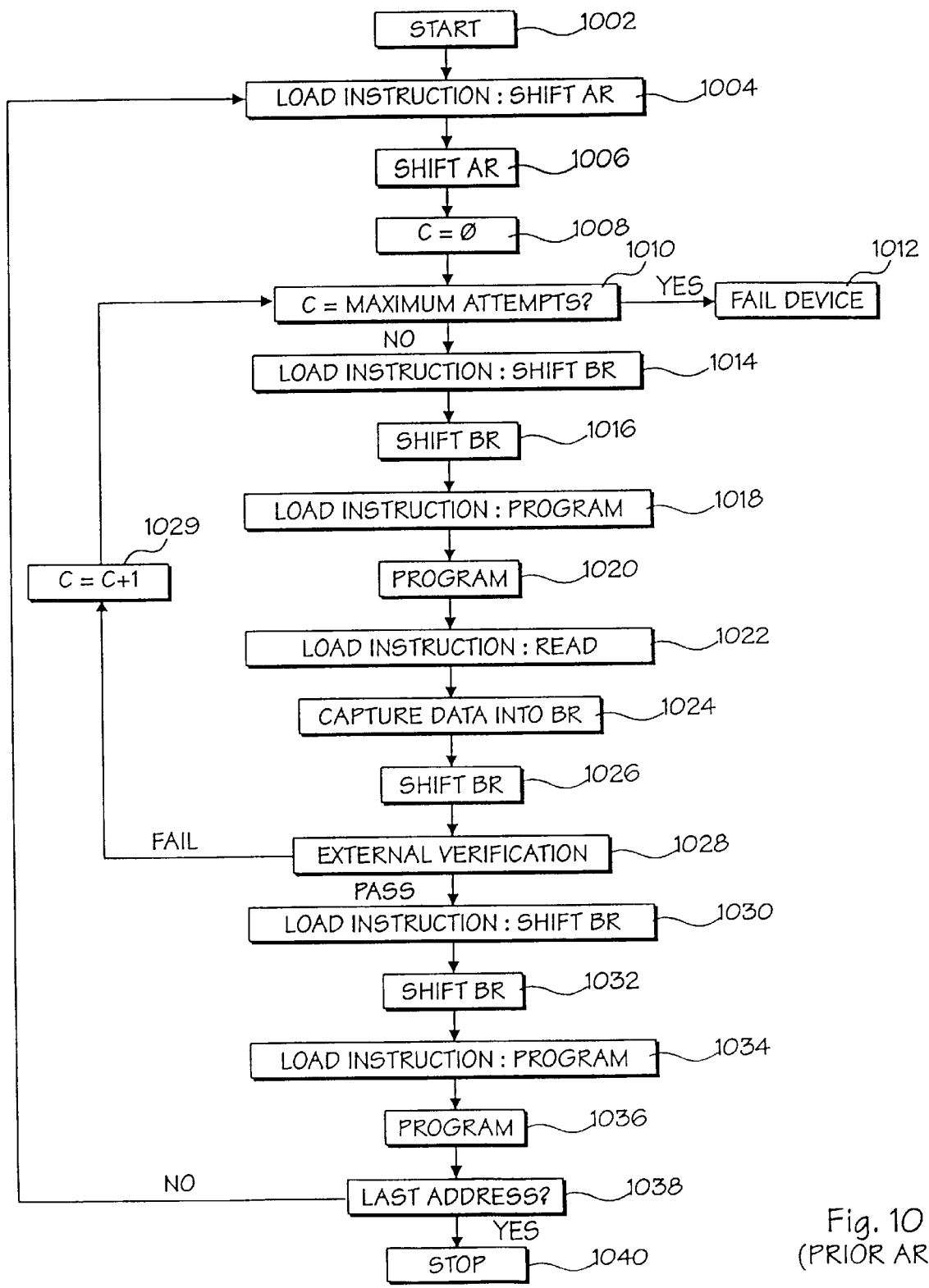
FIG. 10 illustrates a prior art method of programming a desired pattern into a programmable device using the test circuit of FIG. 5.

Given that instruction register 1106 comprises Z bits, address register 1110 comprises Y bits and data register 1108 and read register 1132 each comprise X bits, the program flow illustrated in FIG. 12 requires only 3Z+Y+2X clock cycles to program, verify and overprogram one memory location (ignoring clock state transitions). That is, Z clock cycles to perform each of steps 1204, 1218 and 1226, X+Y clock cycles to perform step 1206 and an additional X clock cycles to perform step 1222. This is a significant reduction of 3Z+X clock cycles over the 6Z+Y+3X clock cycles required in one method illustrated in FIG. 10, and a significant reduction of 2Z clock cycles over the 5Z+Y+2X clock cycles required in another method previously described in reference to FIG. 10. Additionally, when a program location does not verify, it requires only 2Z+X clock cycles to perform a reprogramming. Moreover, when another memory location is to be programmed, it requires only 2Z+Y+2X clock cycles to perform the programming flow once again. This saves an additional Z clock cycles. The savings in the number of clock cycles is attributable to both the use of read register 1132 and the new multi-purpose instruction program/shift AR & BR. Read register 1132 enables the program data to remain undisturbed in data register 1108 when verify data is captured from the memory location in memory 1128 into read register 1132. Additionally, the program data is already in data register 1108 when the overprogramming step is executed at step 1228. The multi-purpose instruction program/shift AR & BR performs the dual role of instructing test circuit 1100 to program a memory location and to shift program data into data register 1108 and address information into address register 1110.

Figure 13:
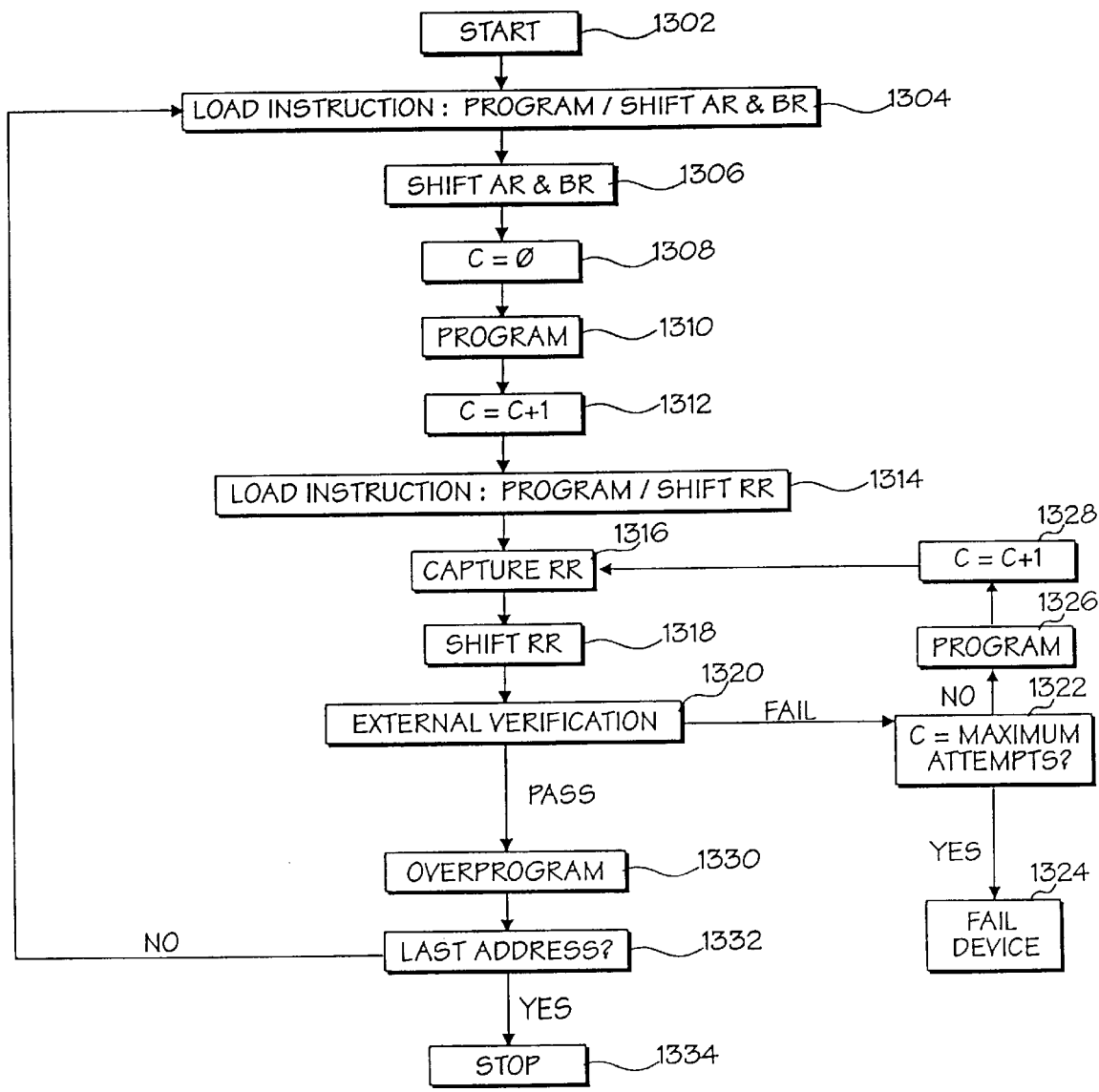
FIG. 13 illustrates another embodiment, according to the present invention, of a method for programming a programmable device using the test circuit of FIG. 11.

Another program flow example using the architecture of FIG. 11 is illustrated in FIG. 13. Steps 1302 through 1308 comprise like steps as illustrated in FIG. 12 and load program data into data register 1108 and address information into address register 1110 in response to the program/shift AR & BR instruction. At step 1310, the program data is programmed into a memory location in memory 1128 having an address defined by the address information stored in address register 1110. At step 1312, C is incremented by one. At step 1314, a new instruction is shifted into instruction register 1106. The new instruction, program shift/RR, instructs test circuit 1100, in one instruction, to read or capture verify data from the programmed memory location into read register 1132 and to program the data in data register 1108 again into the memory location. At step 1316, the verify data is captured into read register 1132. At step 1318, the verify data is shifted out of read register 1132 through selector 1116 to TDO. The verify data is externally compared against the program data at step 1320. If the external comparison does not indicate a match between the verify data and the program data, the program flow determines if the maximum number of programming attempts have been reached at step 1322. If the maximum number of programming attempts have not been reached (e.g. four programming attempts), the program data in data register 1108 is programmed again into the memory location at step 1326. At step 1328, C is incremented by one and the flow returns to step 1316. If the maximum number of programming attempts has been reached, the program flow fails the device at step 1324.

If the program data matches the verify data at step 1320, the program flow overprograms, or programs again, the program data stored in data register 1108 into the memory location. At step 1332, the program determines if another memory location is to be programmed. If so, the program flow updates the address information and/or the program data and returns to step 1304. If another memory location is not to be programmed, the program flow stops at step 1334.

The program flow illustrated in FIG. 13 requires only 2Z+Y+2X clock cycles to program, verify and overprogram one memory location. That is, Z clock cycles to perform each of steps 1304 and 1314, X+Y clock cycles to perform step 1306 and an additional X clock cycles to perform step 1318. This is a significant reduction of 4Z+X clock cycles over the 6Z+Y+3X clock cycles required in one method illustrated in FIG. 10, and a reduction of 3Z clock cycles over the 5Z+Y+2X clock cycles required in another method previously described in reference to FIG. 10. Additionally, when a program location does not verify (fails step 1320), it requires only X clock cycles to perform reprogramming. This is compared against 3Z+2X clock cycles required in one reprogramming method illustrated in FIG. 10, and 2Z+X clock cycles required in another method previously described in reference to FIG. 10. The savings in the number of clock cycles is attributable to both the use of read register 1132 and the new multi-purpose instructions program/shift AR & BR and program/shift RR.

The architecture of FIG. 11 may be expanded to encompass memory locations having widths which comprise a greater number of bits than read register 1132 and/or data register 1108. In this case, bytes of verify data (or other selected subsets of data) may be captured into read register 1132 and compared against data register 1108. Based on the comparison, more bytes of data may be captured and compared.

As described above, the programming methods illustrated in FIG. 12 and FIG. 13 are implemented using the architecture of FIG. 11 which is compatible with the JTAG specification. It will be appreciated by one skilled in the art that the order of some of the method steps may be altered within the scope of the present invention. The new instructions illustrated in FIGS. 12 and 13 take advantage of the TAP controller state diagram illustrated in FIG. 6 in order to provide multi-purpose programming instructions. The following is pseudo-code which will be understood by one of ordinary skill in the art, and which describes the implementation of the programming methods illustrated in FIGS. 12 and 13.

---

FIG. 12 Pseudo-Code

Load Instruction: program/shift AR & BR
    Select-IR-Scan
    Capture-IR
    Shift-IR    (Z shifts)
    Exit1-IR
    Update-IR

FIG. 12 Pseudo-Code -continued

```
Repeat LOOP1 for all memory locations to be programmed
    Shift AR & BR
        Select-DR-Scan
        Capture-DR
        Shift-DR      (X + Y shifts)
        Exit1-DR
        Update-DR
    Repeat LOOP2 until location verifies
        Program
            Run-Test/Idle
            Select-DR-Scan
        Load Instruction: capture RR
            Select-IR-Scan
            Capture-IR
            Shift-IR      (Z shifts)
            Exit1-IR
            Update-IR
        Verify
            Select-DR-Scan
            Capture-DR
            Shift-DR      (X shifts)
            Exit1-DR
            Update-DR
        Load Instruction: program/shift AR & BR
            Select-DR-Scan
            Select-IR-Scan
            Capture-IR
            Shift-IR      (Z shifts)
            Exit1-IR
            Update-IR
    END LOOP2
    Overprogram
        Run-Test/Idle
END LOOP1
```

FIG. 13 Pseudo-Code

```
Repeat LOOP1 for all memory locations to be programmed
    Load Instruction: program/shift AR & BR
        Select-IR-Scan
        Capture-IR
        Shift-IR      (Z shifts)
        Exit1-IR
        Update-IR
    Shift AR & BR
        Select-DR-Scan
        Capture-DR
        Shift-DR      (X + Y shifts)
        Exit1-DR
        Update-DR
    Program
        Run-Test/Idle
        Select-DR-Scan
    Load Instruction: program/shift RR
        Select-IR-Scan
        Capture-IR
        Shift-IR      (Z shifts)
        Exit1-IR
        Update-IR
    Verify
        Select-DR-Scan
        Capture-DR
        Shift-DR      (X shifts)
        Exit1-DR
        Update-DR
    Repeat LOOP2 until location verifies
        Reprogram
            Run-Test/Idle
        Verify
            Select-DR-Scan
            Capture-DR
            Shift-DR      (X shifts)
            Exit1-DR
            Update-DR
    END LOOP2
```

FIG. 13 Pseudo-Code -continued

```
    Overprogram
        Run-Test/Idle
        Select-DR-Scan
END LOOP1
```

The architecture of FIG. 11, and the programming methods illustrated in FIG. 12 and FIG. 13 require the verify data be captured into read register 1132, shifted out of test circuit 1100, and externally compared against the program data. It thus requires one clock cycle to shift each bit of verify data stored in read register 1132. An improved architecture for programming and testing a device using only one clock to shift out a comparison result and not using a read register is illustrated in FIG. 14.

Figure 14:
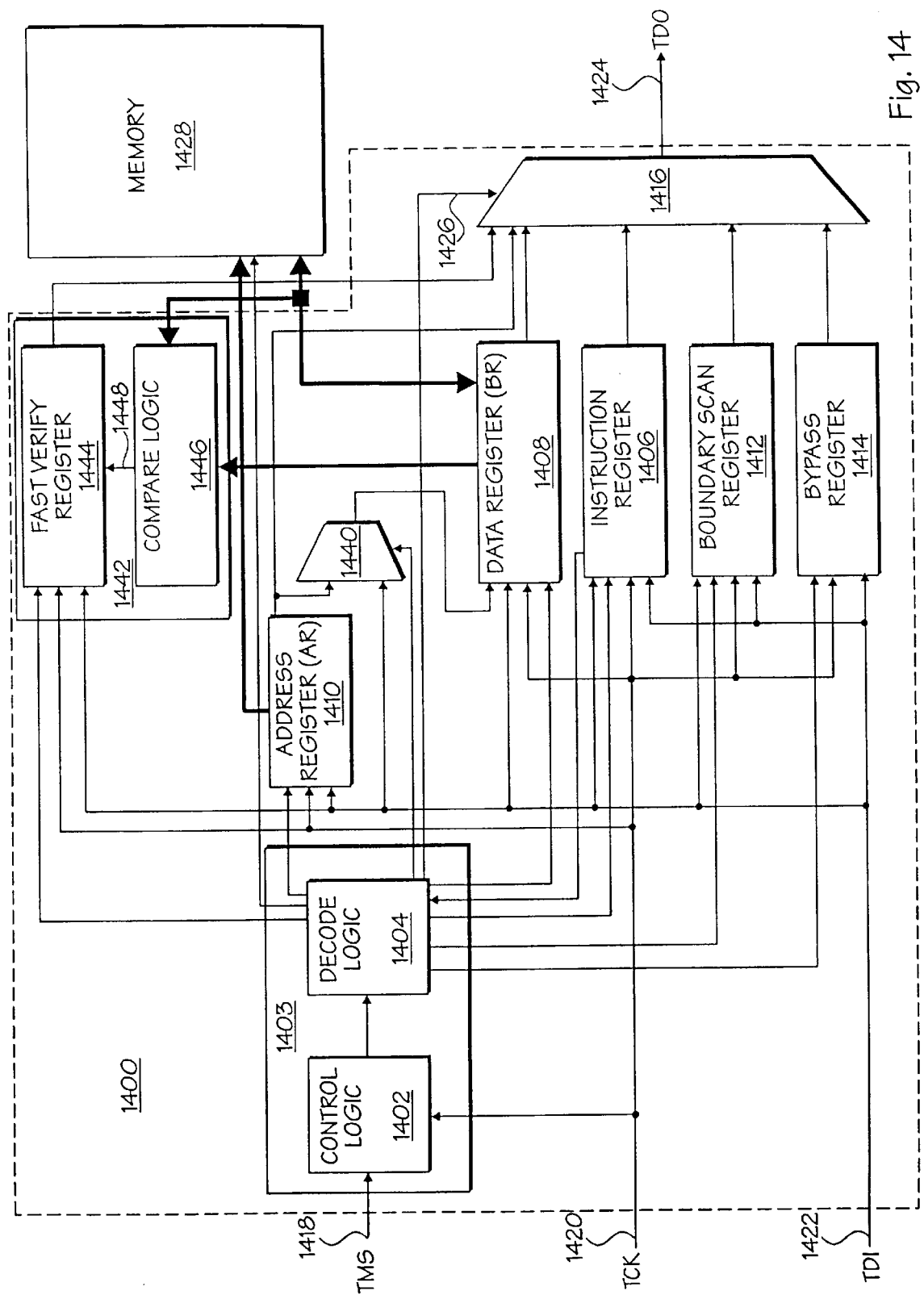
FIG. 14 illustrates one embodiment of a test circuit according to the present invention.

FIG. 14 illustrates a novel test circuit 1400 according to the present invention. Test circuit 1400 may be implemented in a device under test, such as a CPLD, as illustrated in FIG. 4a, or in a plurality of devices under test cascaded together in a serial configuration as illustrated in FIG. 4b. Test circuit 1400 is compatible with the JTAG specification and may be adjusted in a manner known by those skilled in the art to be compatible with other test standards or architectures.

Figure 5:
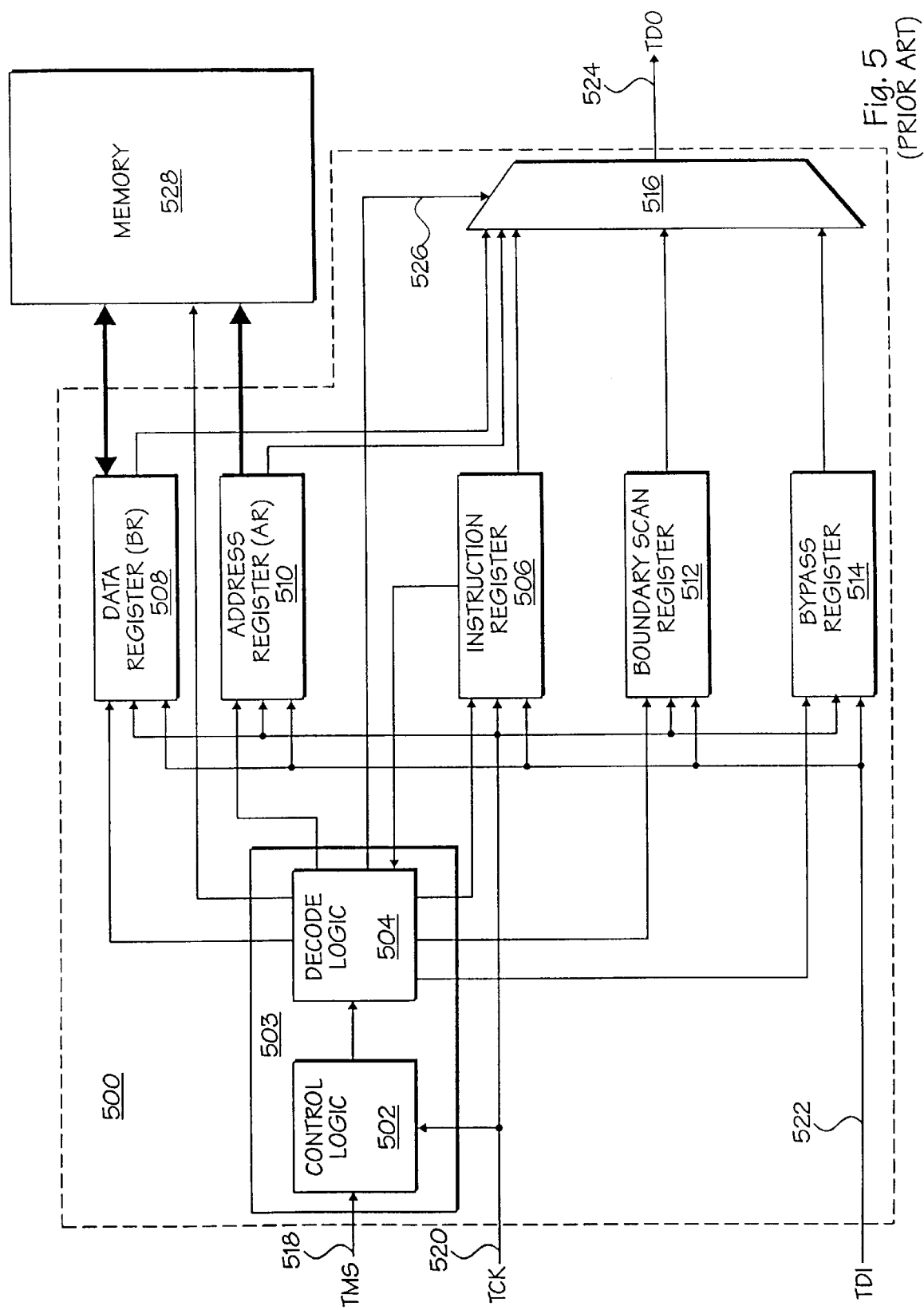
FIG. 5 illustrates a prior art embodiment of a serial test circuit compatible with the JTAG specification.

Test circuit 1400 includes a controller 1403 which comprises control logic 1402 and decode logic 1404. Control logic 1402 receives and interprets the signals on TMS at node 1418 and TCK at node 1420. Together with decode logic 1404, control logic 1402 generates clock and/or control signals as required by test circuit 1400. It will be appreciated that control logic 1402 and decode control logic 1404 may be integrated into one functional block to perform the functions necessitated by controller 1403. Test logic 1400 further includes instruction register 1406, data register 1408, address register 1410, boundary scan register 1412 and bypass register 1414. Each register is configured to receive input signals from decode logic 1404, TCK and TDI. Each of these registers operate in a similar manner as registers 506 through 514 described in FIG. 5. Other registers may be included in test circuit 1400 (e.g. a device identification register or other user-defined registers). It will be appreciated that bypass register 1414 and boundary scan register 1412 are not required in order to practice the present invention. Additionally, test logic 1400 includes selector 1416 which is controlled by a select signal at node 1426. Selector 1416 receives data serially shifted out from fast verify register 1444, data register 1408, address register 1410, instruction register 1406, boundary scan register 1412 and bypass register 1414. In response to the select signal at node 1426, selector 1416 selectively couples the serial data received from one of the various registers to TDO at node 1424. Selector 1416 may comprise, for example, a 6-to-1 multiplexer.

Test circuit 1400 additionally includes fast verify logic 1442. Fast verify logic 1442 compares program data in data register 1408 with verify data read from a memory location addressed by address information stored in address register 1410. The result of the fast verify comparison is provided to selector 1416 in response to the transition of TCK at node 1420. As shown in FIG. 14, fast verify logic 1442 comprises compare logic 1446 coupled to fast verify register 1444. Fast verify register 1444 may comprise a one-bit register or a multi-bit register. Fast verify register 1444 receives TCK, TDI and control signals from decode logic 1404. Compare logic 1446 provides a verify signal to fast verify register 1444 at node 1448. Fast verify register 1444 is parallel loaded when test circuit 1400 executes a program/fast verify instruction. The verify signal at node 1448 is generated from the program data stored in data register 1408 and the verify data read from the addressed memory location in memory 1428.

With respect to FIG. 14, fast verify logic 1442 includes fast verify register 1444. Through the use of fast verify register 1444, multiple CPLDs which have fast verify logic, such as fast verify logic 1442, can be cascaded together and use the fast verify technique according to the present invention. The output signals generated by each of the fast verify logic blocks may be shifted through the chain of cascaded CPLDs and be externally monitored.

Figure 15:
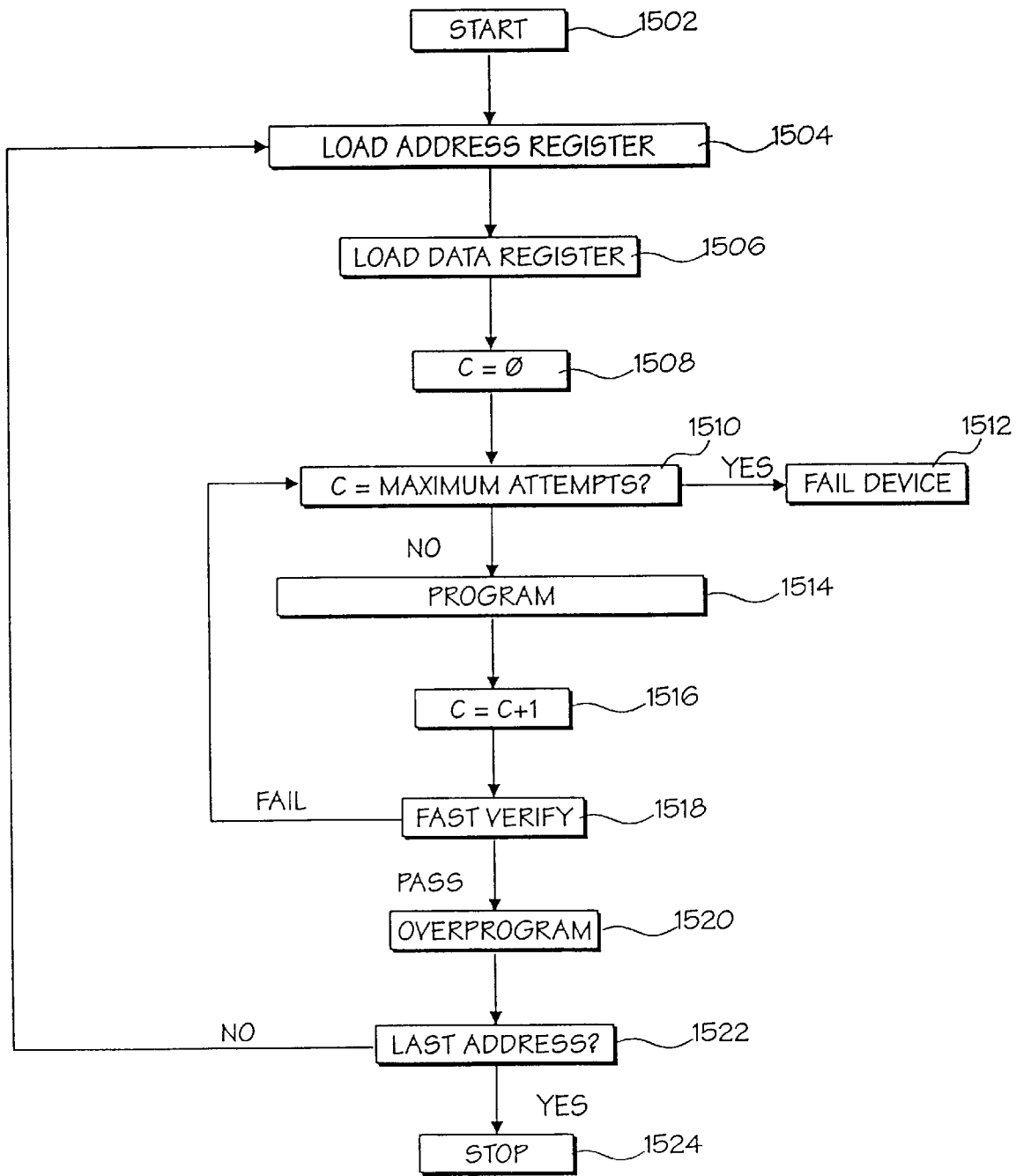
FIG. 15 illustrates one embodiment, according to the present invention, of a method for programming a programmable device using the test circuit of FIG. 14.

FIG. 15 illustrates an overall program flow for programming a desired pattern, fast verifying and overprogramming or reprogramming using fast verify logic 1442, a program/fast verify instruction and the novel test logic illustrated in FIG. 14. The program flow starts at step 1502. At step 1504, address information is loaded into address register 1410. At step 1506, program data is loaded into data register 1408. At step 1508, counter variable C is set to zero. At step 1510, the program flow determines if C has reached the maximum number of programming attempts. If so, then the device under test fails at step 1512. If C has not reached the maximum number of programming attempts, the program data is programmed into a memory location in memory 1428 at step 1514, At step 1516, C is incremented by one. At step 1518, the programming is immediately verified by reading verify data from the programmed memory location and using fast verify logic 1442. If fast verify logic 1442 indicates that the verify data does not match the program data, the program flow returns to step 1510 to reprogram the program data. If fast verify logic 1442 indicates that the verify data matches the program data, the program data is overprogrammed into the memory location at step 1520. At step 1522, the program flow determines if another memory location is to be programmed. If so, the address information and/or the program data is updated and the program flow returns to step 1504. If another memory location is not to be programmed, the program flow stops at step 1524.

Figure 16A:
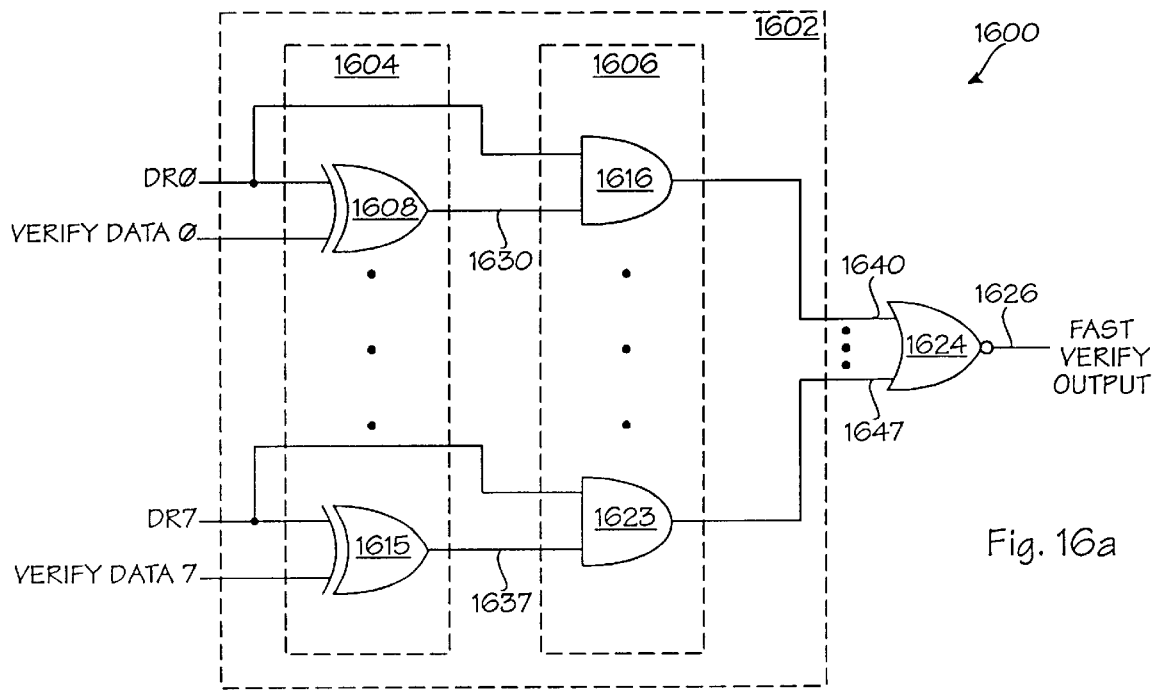
FIG. 16a illustrates one embodiment of fast verify logic according to the present invention.

Fast verify logic 1442 compares the verify data read from a memory location in memory 1428 and the program data stored in data register 1408. In contrast to the compare logic employed in the 22V10D Flash PLD, fast verify logic 1442 uses the program data as a mask in order to generate an output signal from compare logic 1442. This self-masking of the program data does not require an additional mask register. One embodiment of compare logic 1446 which implements the masking of program data stored in data register 1408 is illustrated in FIG. 16a as compare logic 1600. Compare logic 1600 comprises a first logic block 1602 coupled to a second logic block comprising inverted OR (NOR) gate 1624. First logic block 1602 comprises a first plurality of logic elements 1604, namely, eight exclusive OR (XOR) gates 1608 through 1615. Each of XOR gates 1608 through 1615 receives one bit of program data from data bits DR0 through DR7 from data register 1408, and one bit of verify data from verify data 0 through verify data 7 which is read from a memory location in memory 1428. It will be appreciated that any equal number of bits of program data or verify data may be supplied to a corresponding number of XOR gates in first logic block 1602. XOR gates 1608 through 1615 compare each of the program data bits with a corresponding bit from the verify data and produce a plurality of match signals at nodes 1630 through 1637. A match signal indicates whether a program data bit matches (i.e. has the same logic level) as a corresponding verify data bit. When a match occurs, the appropriate match signal comprises a logic zero level.

The plurality of match signals is provided to another plurality of logic elements 1606, namely, eight AND gates 1616 through 1623. The plurality of match signals is compared with corresponding program data bits by AND gates 1616 through 1623 to produce a plurality of mask result signals at nodes 1640 through 1647. The plurality of mask result signals is then provided to the inputs of NOR gate 1624. NOR gate 1624 receives the plurality of mask result signals and generates a verify signal at fast verify output node 1626. The verify signal at node 1626 comprises the verify signal at node 1448 illustrated in FIG. 14.

The verify signal at node 1626 comprises a logic one level, indicating a match between the programmed data bits having a logic one level and the corresponding verify data bits, only when all of the mask result signals comprise logic zero levels. A mask result signal will comprise a logic zero level when a program data bit matches a corresponding verify data bit, or when a program data bit comprises a logic zero level (indicating that the program data bit did not program a corresponding bit in a memory location in memory 1428). A mask result signal will comprise a logic one level only if a program data bit does not match a corresponding verify data bit and the program data bit comprises a logic one level. Therefore, only those bits of a memory location which were actually programmed, as indicated by a logic one level in the program data bits, are compared with the match signals by AND gates 1616 through 1623. Thus, the program data acts as a mask in generating the mask result signals. Any memory location bit which corresponds to a program bit in data register 1408 that comprises a logic zero level, does not affect the verify signal provided to fast verify register 1444.

Figure 16B:
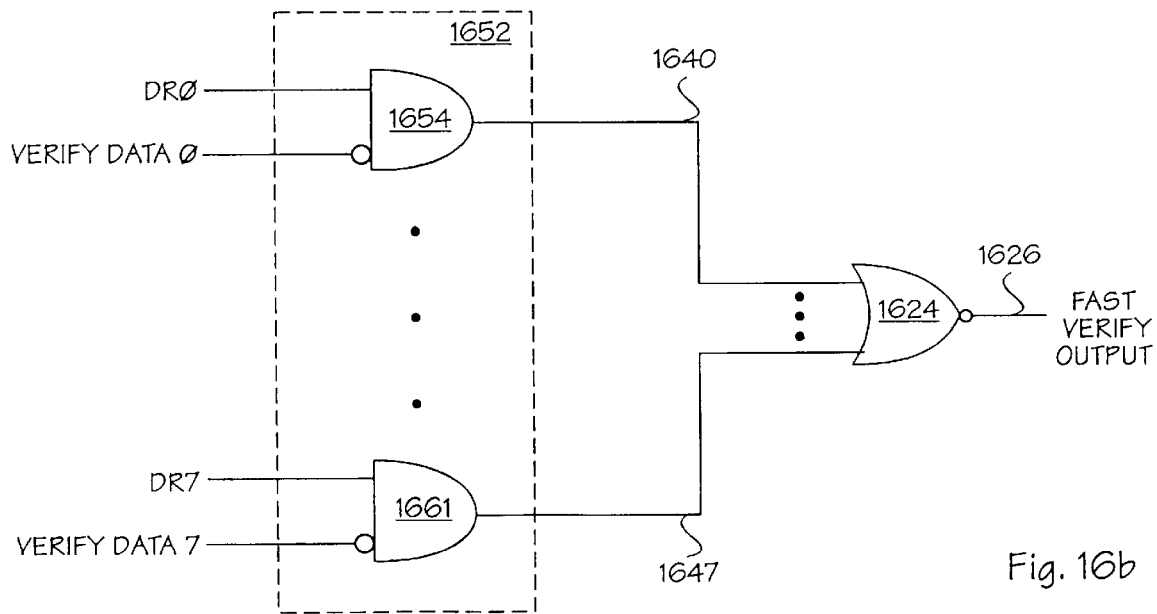
FIG. 16b illustrates another embodiment of fast verify logic according to the present invention.

It will be appreciated that first logic block 1602 may be simplified, as illustrated in FIG. 16b, into logic block 1652 comprising AND gates 1654 through 1661. Each of AND gates 1654 through 1661 receives one program data bit and the logical inverse of one verify data bit.

Figure 17A:
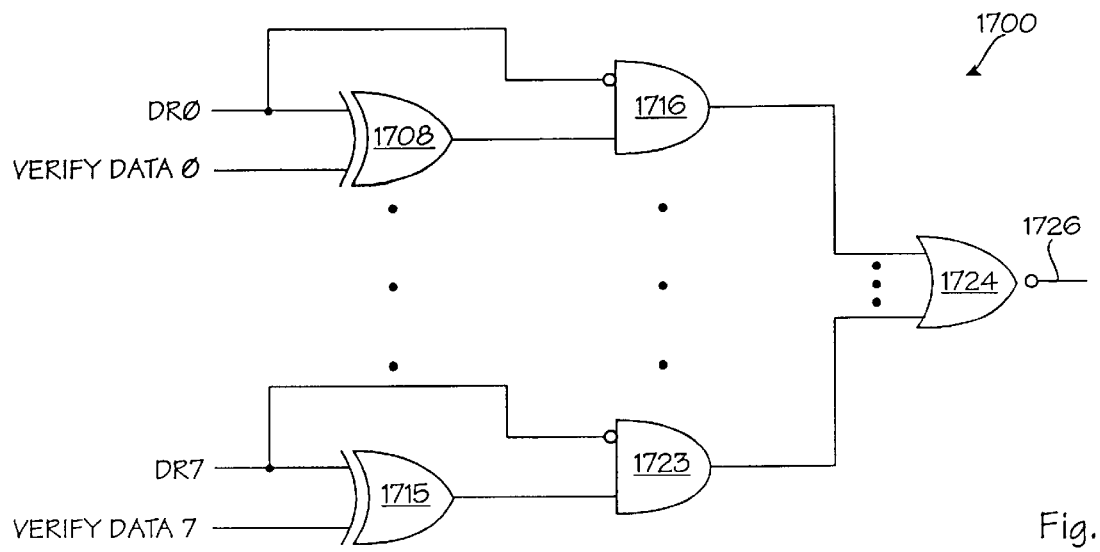
FIG. 17a illustrates another embodiment of fast verify logic according to the present invention.
Figure 17B:
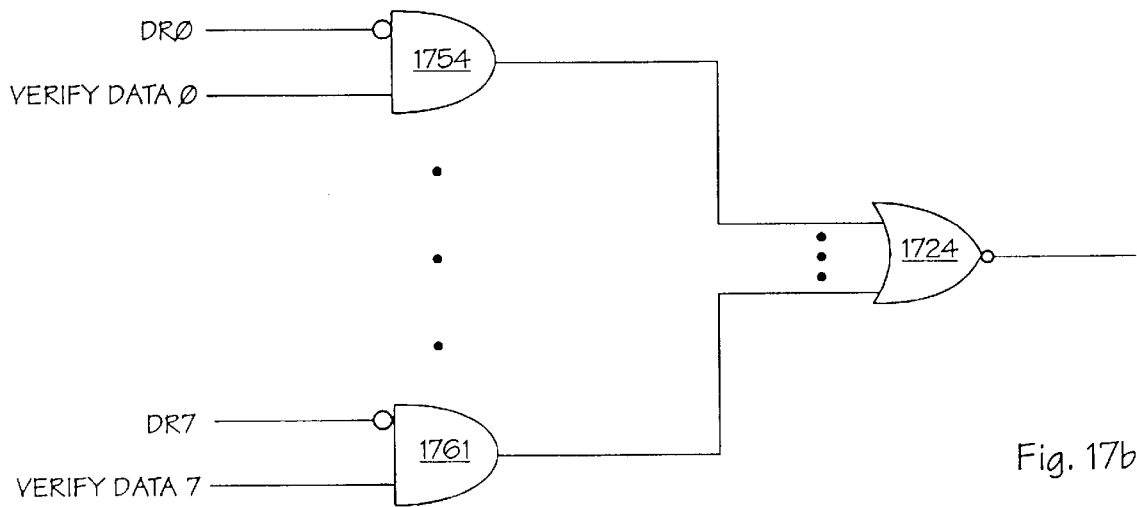
FIG. 17b illustrates another embodiment of fast verify logic according to the present invention.

Compare logic 1600 illustrated in FIG. 16a and FIG. 16b generates a verify signal comprising a logic one level when the program data bits comprising a logic one level match the verify data bits read from the programmed memory location. FIGS. 17a and 17b illustrate another embodiment of the present invention. In this embodiment the verify signal output by compare logic 1700 at node 1726 comprises a logic one level only when each of the program data bits which comprise a logic zero level matches each of the corresponding verify data bits which comprise a logic zero level. FIG. 17a implements the appropriate compare logic with XOR gates 1708 through 1715, AND gates 1716 through 1723 and NOR gate 1724 which are interconnected and operate in a similar manner as like numbered elements illustrated in FIG. 16a. AND gates 1716 through 1723 receive inverted program data bits and a plurality of match signals in FIG. 17a. Additionally, XOR gates 1708 through 1715 and AND gates 1716 through 1723 may be simplified to AND gates 1754 through 1761 illustrated in FIG. 17b. Each of AND gates 1754 through 1761 receives a verify data bit and an inverted program data bit and generates a mask result signal.

Figure 18A:
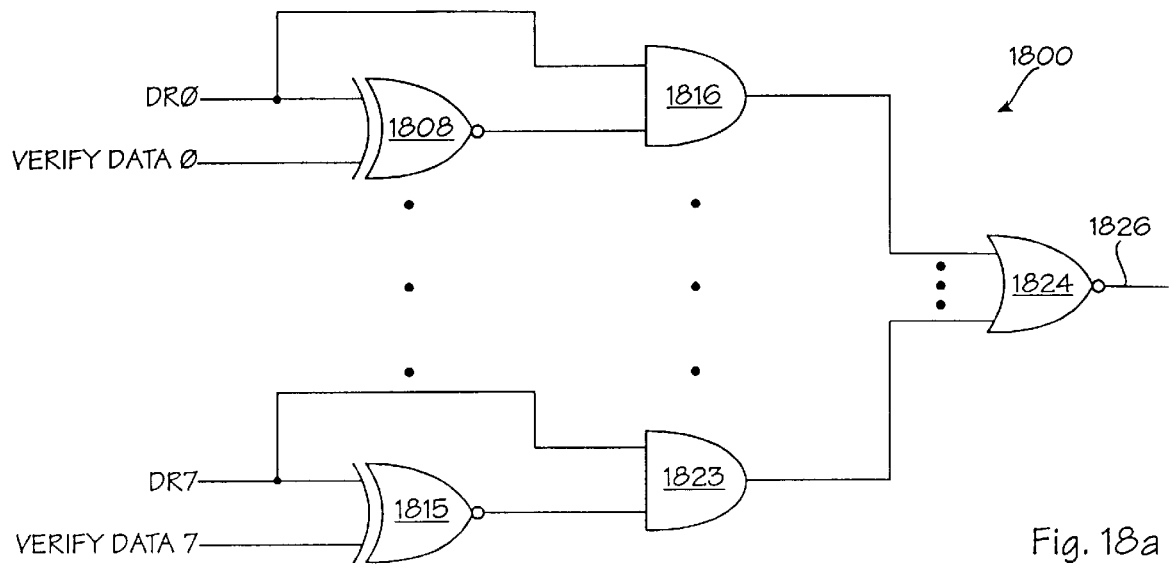
FIG. 18a illustrates another embodiment of fast verify logic according to the present invention.
Figure 18B:
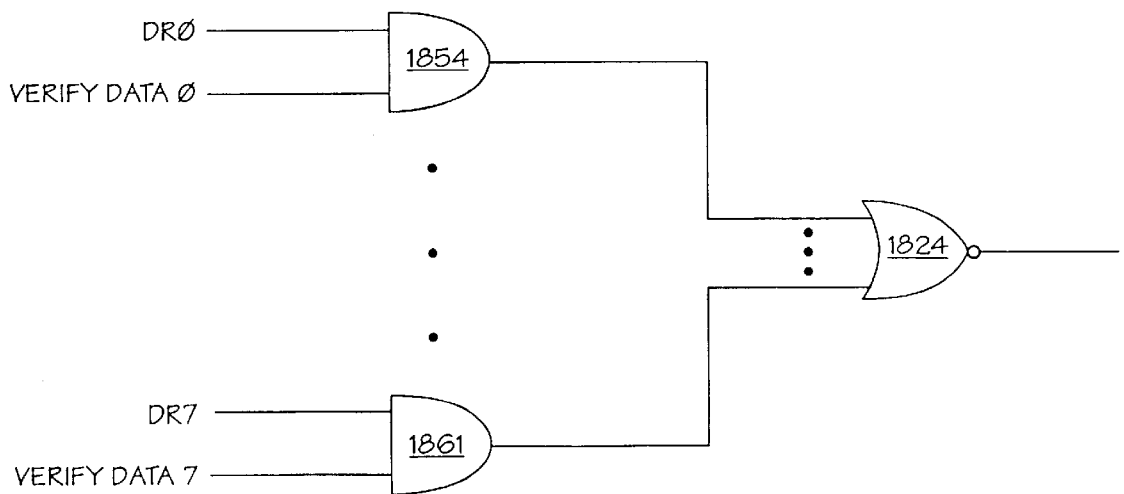
FIG. 18b illustrates another embodiment of fast verify logic according to the present invention.

FIGS. 18a and 18b illustrate another embodiment of the present invention. In this embodiment the verify signal output by compare logic 1800 at node 1826 comprises a logic one level only when each of the program data bits which comprise a logic one level "matches" each of the corresponding verify data bits which comprise a logic zero level. FIG. 18a implements the appropriate compare logic with XNOR gates 1808 through 1815, AND gates 1816 through 1823 and NOR gate 1824 which are interconnected and operate in a similar manner as like numbered elements illustrated in FIG. 16a. Additionally, XNOR gates 1808 through 1815 and AND gates 1816 through 1823 may be simplified to AND gates 1854 through 1861 illustrated in FIG. 18b. Each of AND gates 1854 through 1861 receives a verify data bit and a program data bit and generates a mask result signal.

Figure 19A:
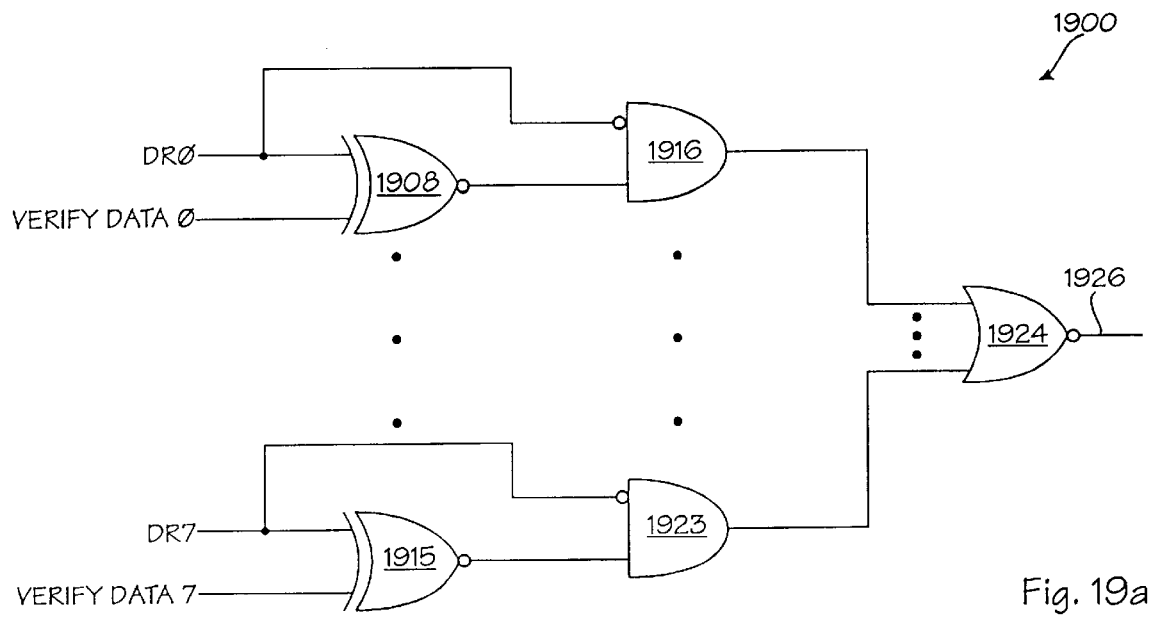
FIG. 19a illustrates another embodiment of fast verify logic according to the present invention.
Figure 19B:
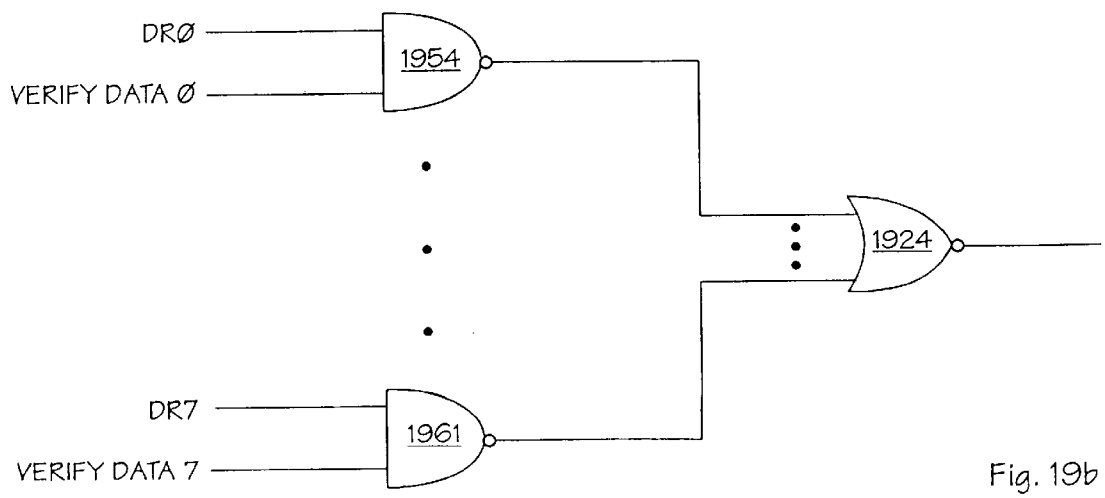
FIG. 19b illustrates another embodiment of fast verify logic according to the present invention.

FIGS. 19a and 19b illustrate another embodiment of the present invention. In this embodiment the verify signal output by compare logic 1900 at node 1926 comprises a logic one level only when each of the program data bits which comprise a logic zero level "matches" each of the corresponding verify data bits which comprise a logic one level. FIG. 19a implements the appropriate compare logic with XNOR gates 1908 through 1915, AND gates 1916 through 1923 and NOR gate 1924 which are interconnected and operate in a similar manner as like numbered elements illustrated in FIG. 16a. AND gates 1916 through 1923 receive inverted program data bits and the plurality of match signals in FIG. 19a. Additionally, XNOR gates 1908 through 1915 and AND gates 1916 through 1923 may be simplified to NOR gates 1954 through 1961 illustrated in FIG. 19b. Each of NOR gates 1954 through 1961 receives a verify data bit and a program data bit and generates a mask result signal.

It is a significant aspect of the present invention that only those program data bits that are actually programmed into a memory location are used in the comparison of verify data read back from the programmed memory location. This self-masking allows for single-bit programming and multi-bit programming. Using the single-bit programming example described above, if an eight bit data pattern to be programmed using single-bit programming comprises 00001010, the first single-bit programming data pattern to be loaded into data register 1408 would comprise 00000010. In the immediately following fast verify function, the verify data would also comprise 00000010, and fast verify logic 1442 would generate a logic one level. The second single-bit programming data pattern to be loaded into data register 1408 and programmed into the appropriate memory location would comprise 00001000. The verify data now read from the programmed memory location would comprise 00001010. This bit pattern would be compared by compare logic 1446 against 00001000 stored in data register 1408. Given that only logic one level program data bits are compared against corresponding verify data bits, as illustrated in FIG. 16a, the result of the fast verify would indicate a match. Fast verify logic 1442 also handles multi-bit programming in a similar fashion.

Fast verify logic 1442 has another significant advantage, in that when the memory location to be programmed in memory 1428 comprises less bits than are present in data register 1408, the user does not have to know default states to be loaded into the unused data register bits. Instead, the user simply does not program these bits, that is, the user loads these bits with logic zero levels. Since only the logic one level program data bits influence the result of the fast verify function, the program data bits comprising a logic zero level are excluded from the fast verify comparison.

The architecture of test circuit 1400 is an improvement upon the test circuit architecture described in U.S. patent application Ser. No. 08/576,451 entitled "A Method and Apparatus for Testing a Device" filed Dec. 21, 1995 assigned to the assignee of the present application.

Additionally, the new programming instructions described below are an improvement upon those described in Ser. No. 08/576,451. It will be appreciated by one skilled in the art that fast verify logic 1442 may be utilized in other test architectures. For example, fast verify logic 1442 may be incorporated into test circuit 1100 illustrated in FIG. 11 or test circuit 500 illustrated in FIG. 5.

The architecture of test circuit 1400 does provide more benefits in addition to those already described, namely, a new set of instructions according to the present invention may operate on test circuit 1400 to enable the programming and testing of a device under test in a significantly reduced number of clock cycles over the prior art. The new programming instructions take advantage of the TAP controller state diagram illustrated in FIG. 6 to provide multi-purpose instructions. The multi-purpose instructions combine the shifting of program data, verify data and address information to and from the various registers illustrated in FIG. 14, with the programming, fast verifying, reprogramming and overprogramming of a memory location in memory 1428. Additionally, the new programming instructions may be optimally used to improve the program flow charts illustrated in FIGS. 1–2 and 7–10 to reduce the number of clock cycles and instructions required to implement the program flows and thus significantly increase testing throughput. While specific instructions are illustrated below, other instructions which combine multiple instructions are within the scope of the present invention. These novel programming instructions are decoded by decode logic 1404 and acted upon by controller 1403. The new programming instructions and their definitions are as follows:

Program/Shift AR

When in the Run-Test/Idle TAP controller state, the memory location addressed by the contents of the address register (AR) is programmed based upon the program data pattern contained in the data register (BR).

When in the Shift-DR Tap controller state, the address register is selected for shifting between TDI and TDO.

Program/Shift BR

When in the Run-Test/Idle TAP controller state, the memory location addressed by the contents of the address register is programmed based upon the program data pattern contained in the data register.

When in the Shift-DR Tap controller state, the data register is selected for shifting between TDI and TDO.

Program/Shift AR & BR

When in the Run-Test/Idle controller state, the memory location addressed by the contents of the address register is programmed based upon the program data pattern contained in the data register.

When in the Shift-DR TAP controller state, the concatenation of the address register and the data register is selected for shifting between TDI and TDO.

Program/Fast Verify (Shift FVR)

When in the Run-Test/Idle TAP controller state, the memory location addressed by the contents of the address register is programmed based upon the program data pattern contained in the data register.

When in the Capture-DR TAP controller state, the fast verify register (FVR) is parallel loaded to indicate if the bits of the memory location (verify data) addressed by the contents of the address register that correspond to bits in the data register with a particular logic level have been programmed. This instruction has been described in greater detail above.

When in the Shift-DR TAP controller state, the fast verify register is selected for shifting between TDI and TDO.

Read Location (Shift AR & BR)

When in the Capture-DR TAP controller state, the data register is parallel loaded based upon the programmed state of the memory location addressed by the address register (verify data). The verify data may be parallel loaded into the data register in an inverted or non-inverted state.

When in the Shift-DR TAP controller state, the concatenation of the address register and the data register is selected for shifting between TDI and TDO.

Figure 20:
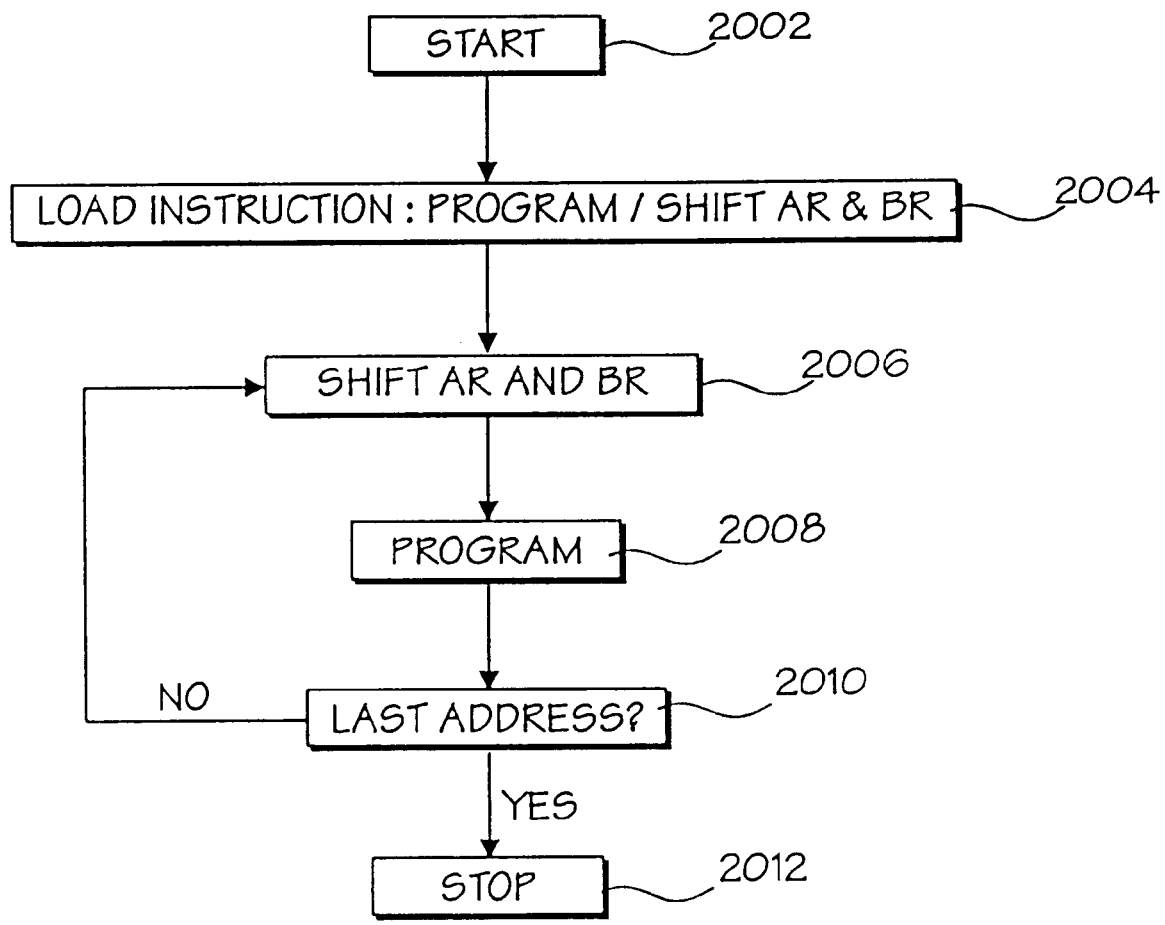
FIG. 20 illustrates another embodiment, according to the present invention, of a method for programming a programmable device using the test circuit of FIG. 14.

FIGS. 20–23 illustrate a novel method for programming and testing a device under test using test circuit 1400 and the program flow charts illustrated in FIGS. 1–2 and 7–10. The programming flow charts of FIGS. 20–23 are implemented using the TAP controller state diagram illustrated in FIG. 6. FIG. 20 illustrates an improved method which significantly reduces the number of instructions and clock cycles over prior art methods for programming a memory location, or multiple memory locations, of a device under test. The program flow illustrated in FIG. 20 may be used for step 120 illustrated in FIG. 1. The program flow starts at step 2002. At step 2004, the instruction program/shift AR & BR is shifted, or loaded, into instruction register 1406 instructing test circuit 1400, in one instruction, to shift program data into data register 1408, shift address information into address register 1410 and program the program data into a memory location in memory 1428 defined by the address information. At step 2006, the concatenation of data register 1408 and address register 1410 is selected, and the program data is shifted into data register 1408 and the address information is shifted into address register 1410. At step 2008, the program data is programmed into the memory location in memory 1428. At step 2010, the program flow determines if another memory location is to be programmed. If so, then the program flow updates the address information and/or program data and returns to step 2006. If no other memory location is to be programmed, the program flow stops at step 2012.

The program flow illustrated in FIG. 20 requires only Z+Y+X clock cycles to program one memory location. That is, Z clock cycles to execute step 2004, and X+Y clock cycles to execute step 2006. This is a significant reduction in the number of clock cycles over the prior art method illustrated in FIG. 8 which requires at least 3Z+Y+X clock cycles. Additionally, the program flow illustrated in FIG. 20 loads only one instruction into instruction register 1406 as opposed to three instructions in the prior art method illustrated in FIG. 8. Significantly, when another location is to be programmed, only X+Y clock cycles are required to repeat steps 2006 through 2008. In contrast, the prior art method of FIG. 8 requires the full 3Z+Y+X clock cycles. The pseudo-code for implementing the program flow illustrated in FIG. 20 is outlined below.

| Pseudo-Code for Program Flow of FIG. 20 |
|---|
| Load Instruction: program/shift AR & BR |
|   Select-IR-Scan |
|   Capture IR |
|   Shift-IR   (Z shifts) |
|   Exit1-IR |
|   Update-IR |
| LOOP until program desired number of memory locations |
|   Shift AR & BR |
|     Select-DR-Scan |

| Pseudo-Code for Program Flow of FIG. 20 -continued |
|---|
|     Capture-DR |
|     Shift-DR   (X + Y shifts) |
|     Exit1-DR |
|     Update-DR |
|   Program |
|     Run-Test/Idle |
| END LOOP |

Figure 21:
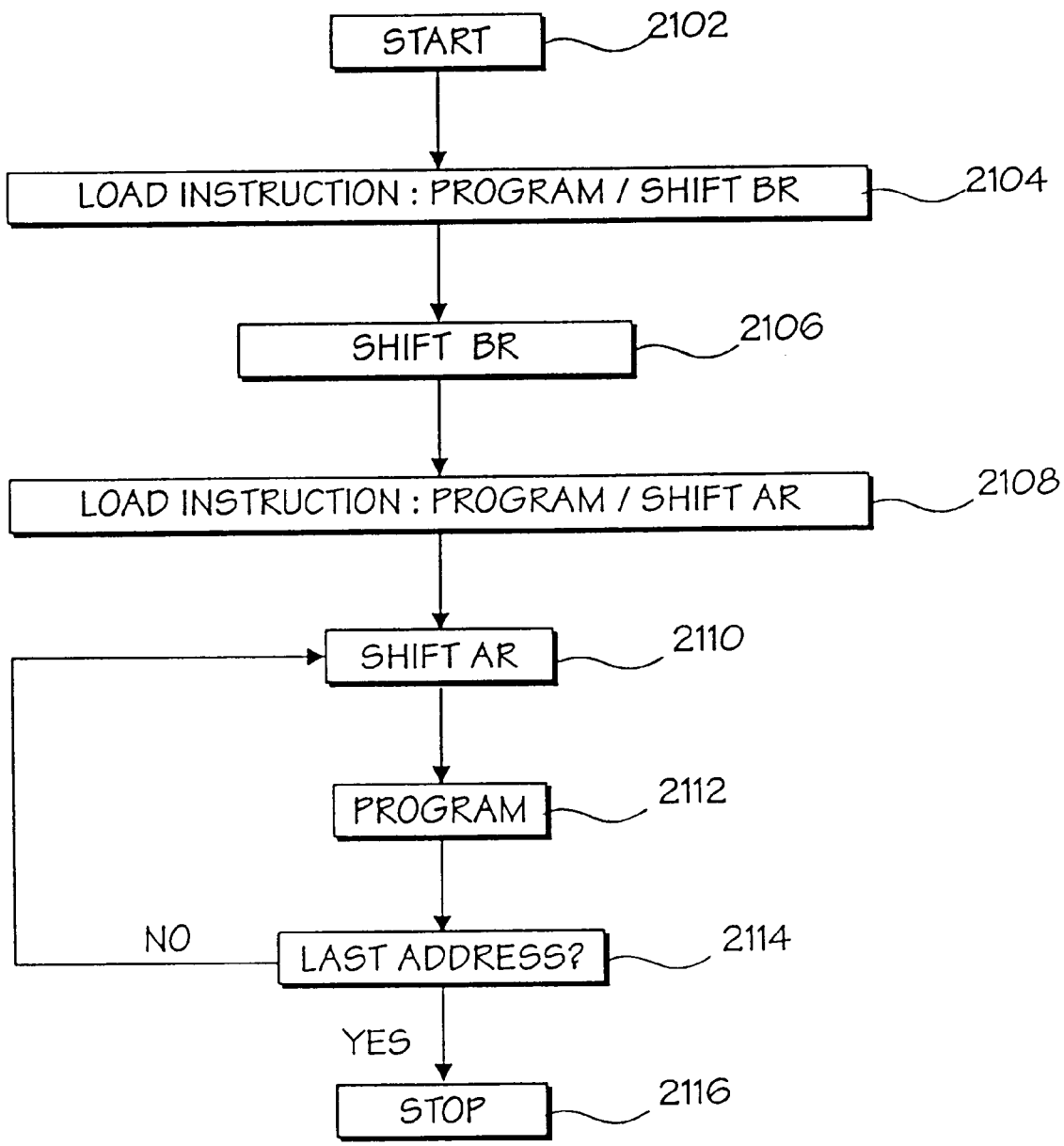
FIG. 21 illustrates another embodiment, according to the present invention, of a method for background programming a programmable device using the test circuit of FIG. 14.

FIG. 21 illustrates an improved method which significantly reduces the number of instructions and clock cycles over prior art methods for programming the same program data into one or multiple memory locations of a device under test. In the program flow illustrated in FIG. 21, the program data comprises the same program data for every memory location. The program flow illustrated in FIG. 21 may be used, for example, to execute step 112 in FIG. 1. The program flow starts at step 2102. At step 2104, the instruction program/shift BR is shifted into instruction register 1406 instructing test circuit 1400, in one instruction, to shift program data into data register 1408 and to program the program data into a memory location. In an alternative embodiment, the instruction may simply instruct test circuit 1400 to shift program data into data register 1408. At step 2106, program data is shifted into data register 1408. At step 2108, the instruction program/shift AR is shifted into instruction register 1406 which instructs test circuit 1400 to shift address information into address register 1410 and to program the program data into a memory location defined by the address information. At step 2110, the address information is loaded into address register 1410. At step 2112, the program data is programmed into the memory location in memory 1428. At step 2114, the program flow determines if another memory location is to be programmed. If so, then the program flow updates the address information and returns to step 2110. If no other memory location is to be programmed, the program flow stops at step 2116.

The program flow illustrated in FIG. 21 requires only 2Z+Y+X clock cycles to program one memory location. That is, Z clock cycles to execute each of steps 2104 and 2108, X clock cycles to execute step 2106, and Y clock cycles to execute step 2110. This is a significant reduction in the number of clock cycles over the prior art method illustrated in FIG. 9 which requires at least 3Z+Y+X clock cycles. Additionally, the program flow illustrated in FIG. 21 loads only two instructions into instruction register 1406 as opposed to three instructions in the prior art method illustrated in FIG. 9. Significantly, when another location is to be programmed with the same background data, only Y clock cycles are required to repeat steps 2110 through 2112. In contrast, the prior art method of FIG. 9 requires 2Z+Y clock cycles. The pseudo-code for implementing the program flow illustrated in FIG. 21 is outlined below.

| Pseudo-Code for Program Flow of FIG. 21 |
|---|
| Load Instruction: program/shift BR |
|   Select-IR-Scan |
|   Capture-IR |
|   Shift-IR   (Z shifts) |
|   Exit1-IR |
|   Update-IR |
| Load BR with background program data pattern |
|   Select-DR-Scan |
|   Capture-DR |

-continued

| Pseudo-Code for Program Flow of FIG. 21 |
| --- |
| Shift-DR    (X shifts) |
| Exit1-DR |
| Update-DR |
| Select-DR-Scan |
| Load Instruction: program/shift AR |
|   Select-IR-Scan |
|   Capture-IR |
|   Shift-IR    (Z shifts) |
|   Exit1-IR |
|   Update-IR |
| LOOP until program all memory locations |
|   Shift AR with address information |
|     Select-DR-Scan |
|     Capture-DR |
|     Shift-DR    (Y shifts) |
|     Exit1-DR |
|     Update-DR |
|   Program |
|     Run-Test/Idle |
| ENDLOOP |
| Select-DR-Scan |

Figure 22:
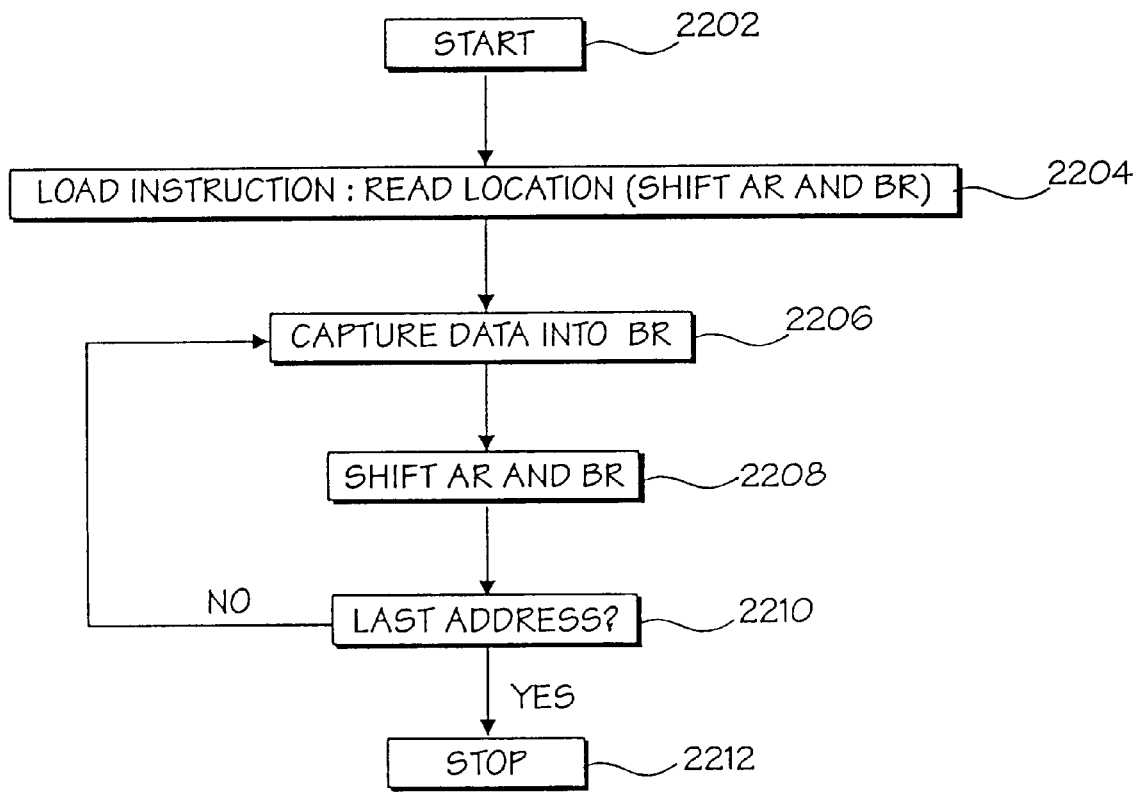
FIG. 22 illustrates another embodiment, according to the present invention, of a method for reading verify data from a programmable device using the test circuit of FIG. 14.

FIG. 22 illustrates an improved method which significantly reduces the number of instructions and clock cycles over prior art methods for reading verify data from a memory location. The verify data may be compared externally to the device under test. The program flow illustrated in FIG. 22 may be used to execute a number of steps in FIG. 1, including, for example, to read and verify a single memory location such as step 104, read and verify multiple locations, or read and verify the entire device under test such as steps 116 and 124. The program flow starts at step 2202. At step 2204, the instruction read location (shift AR & BR) is shifted into instruction register 1406 instructing test circuit 1400, in one instruction, to shift address information into address register 1410, capture verify data from a memory location in memory 1428 to data register 1408, and to output the verify data to TDO. At step 2206, verify data is captured into data register 1408. At step 2208, address information for the next memory location is shifted into address register 1410. At the same time, the captured verify data is shifted out from data register 1408 because address register 1410 and data register 1408 are concatenated together as a result of the instruction in step 2204. Since address register 1410 is first in the concatenation of shifting both address register 1410 and data register 1408, only Y shifts are required (if Y≧X, otherwise X shifts are required) to output the verify data from data register 1408 while simultaneously shifting in the next address to be read. The first time through the program flow the data shifted out of data register 1408 is disregarded. At step 2210, the program flow determines if another memory location is to be read. If so, then the program flow updates the address information and returns to step 2206. If no other memory location is to be read, the program flow stops at step 2212.

The program flow illustrated in FIG. 22 requires only Z+Y clock cycles to read one memory location. That is, Z clock cycles to execute step 2204 and Y clock cycles to execute step 2208. This is a significant reduction in the number of clock cycles over the prior art method illustrated in FIG. 7 which requires at least 2Z+Y+X clock cycles. Additionally, the program flow illustrated in FIG. 22 loads only one instruction into instruction register 1406 as opposed to two instructions in the prior art method illustrated in FIG. 7. Significantly, when another location is to be read, only Y clock cycles are required to repeat steps 2206 through 2208. In general, if Y≧X it requires Y shifts to execute step 2208, otherwise it requires X shifts. Furthermore, if n devices are cascaded, then {[(n−1)*(X+Y)]+Y} shifts are required if Y≧X, otherwise {[(n−1)*(X+Y)+X} shifts are required. In contrast, the prior art method of FIG. 7 requires [n *(2Z+Y+X)] clock cycles. The pseudo-code for implementing the program flow illustrated in FIG. 22 is outlined below.

| Pseudo-Code for Program Flow of FIG. 22 |
| --- |
| Load Instruction: read location (shift AR & BR) |
|   Select-IR-Scan |
|   Capture-IR |
|   Shift-IR    (Z shifts) |
|   Exit1-IR |
|   Update-IR |
| LOOP for all locations to be read |
|   Read Location; Load AR; Unload BR |
|     Select-DR-Scan |
|     Capture-DR |
|     Shift-DR    (Y shifts if not cascaded; see formula) |
|     Exit1-DR |
|     Update-DR |
| END LOOP |
| Select-DR-Scan |

Figure 23:
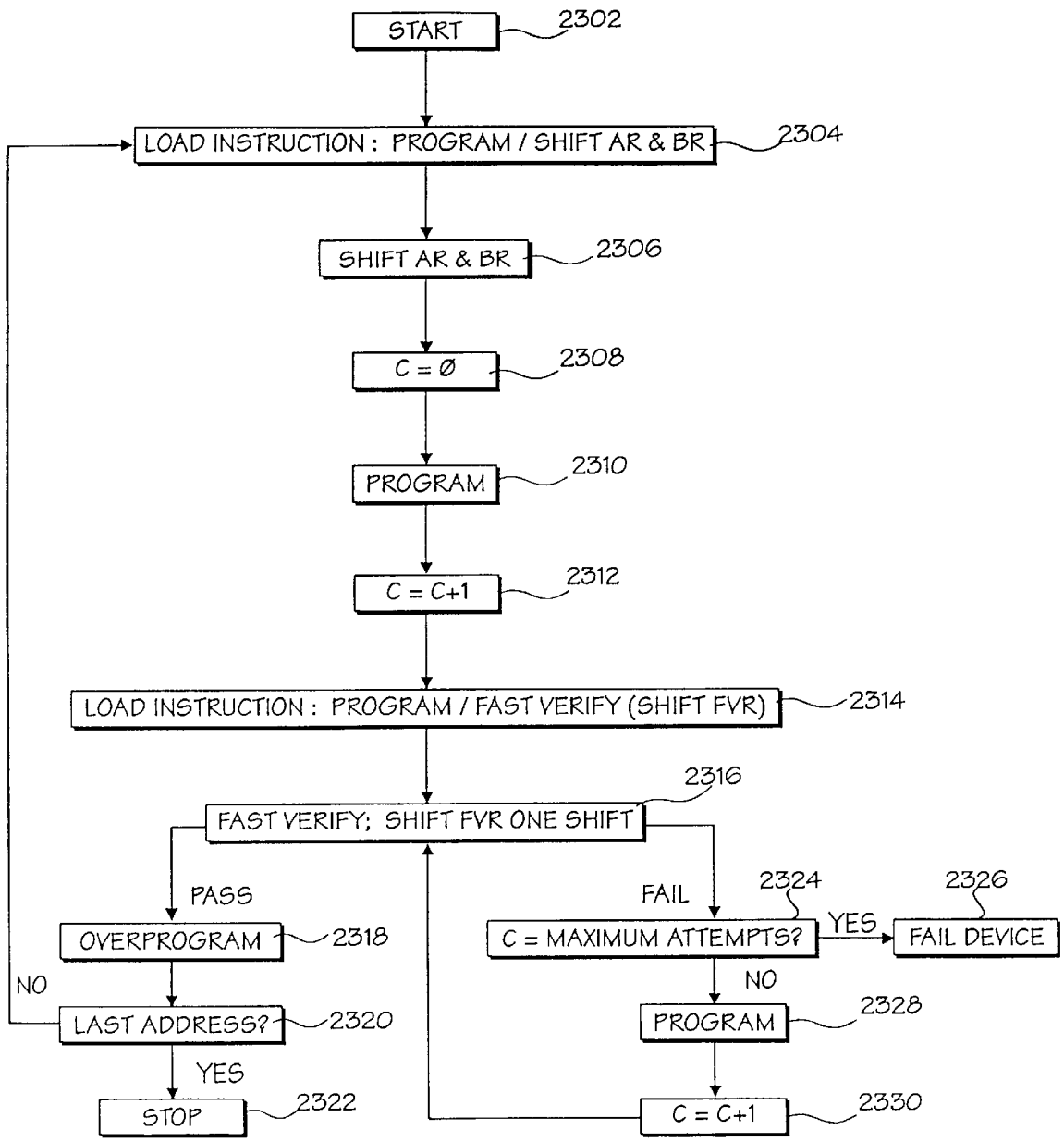
FIG. 23 illustrates another embodiment, according to the present invention, of a method for programming a desired pattern into a programmable device using the test circuit of FIG. 14.

FIG. 23 illustrates an improved method which significantly reduces the number of instructions and clock cycles over prior art methods for programming a desired pattern into a device under test, immediately verifying the programming, and overprogramming the desired pattern. The program flow illustrated in FIG. 23 corresponds to the program flow illustrated in FIG. 2. The program flow starts at step 2302. At step 2304, the instruction program/shift AR & BR is shifted into instruction register 1406 instructing test circuit 1400, in one instruction, to shift program data into data register 1408, shift address information into address register 1410 and program the program data into a memory location defined by the address information. At step 2306, the concatenation of data register 1408 and address register 1410 is selected, and the program data is shifted into data register 1408 and the address information is shifted into address register 1410. At step 2308 counter variable C is set to zero. At step 2310, the program data is programmed in the addressed memory location. At step 2312, C is incremented by one. At step 2314, the instruction program/fast verify is shifted into instruction register 1406 which instructs test circuit 1400 to program the program data into a memory location and to fast verify the verify data read from the programmed memory location. At step 2316, the programming of the memory location in step 2310 is immediately fast verified by fast verify logic 1442. The output signal generated by fast verify logic 1442 is shifted to TDO in response to TCK. At step 2318, the program data is programmed again, or overprogrammed, into the addressed memory location if the program data matches the verify data (verifies). At step 2320, the program flow determines if another memory location is to be programmed. If so, then the program flow updates the address information and/or program data and returns to step 2304. If no other memory location is to be programmed, the program flow stops at step 2322. If, at step 2316, the verify data did not match the program data, the program determines if C equals the maximum number of programming attempts. If so, the device fails at step 2326. If the maximum number of programming attempts has not been reached, the program flow programs again, or reprograms, the program data into the memory location at step 2328. At step 2330, C is incremented by one and the program flow returns to step 2316.

The program flow illustrated in FIG. 23 requires only 2Z+Y+X+1 clock cycles to program, verify and overprogram one memory location. That is, Z clock cycles to execute each of steps 2304 and 2314, X+Y clock cycles to execute step 2306, and one clock cycle to execute step 2316. This is a significant reduction in the number of clock cycles over the prior art method illustrated in FIG. 10 which requires at least 6Z+Y+3X clock cycles in one method, and at least 5Z+Y+2X clock cycles in another method previously described in reference to FIG. 10. Additionally, the program flow illustrated in FIG. 23 loads only two instructions into instruction register 1406 as opposed to five or six instructions in the prior art methods described in reference to FIG. 10. Significantly, when another location is to be reprogrammed, only one clock cycle is required to repeat the steps of reprogramming (step 2328) and fast verifying (step 2316). In contrast, the prior art methods of FIG. 10 require 3Z+2X clock cycles or 2Z+X clock cycles. The pseudo-code for implementing the program flow illustrated in FIG. 23 is outlined below.

---

Pseudo-Code for Program Flow of FIG. 23

---

LOOP1 for all memory locations to be programmed
    Load Instruction: program/shift AR & BR
        Select-IR-Scan
        Capture-IR
        Shift-IR    (Z shifts or less)
        Exit1-IR
        Update-IR
    Load AR & BR
        Select-DR-Scan
        Capture-DR
        Shift-DR   (X + Y shifts)
        Exit1-DR
        Update-DR
    Program
        Run-Test/Idle
        Select-DR-Scan
    Load Instruction: program/fast verify (Shift FVR)
        Select-IR-Scan
        Capture-IR
        Shift-IR    (Z shifts or less)
        Exit1-IR
        Update-IR
    Fast Verify Location
        Select-DR-Scan
        Capture-DR
        Shift-DR    (1 shift)
        Exit1-DR
        Update-DR
    LOOP2 until memory location verifies
        Program
            Run-Test/Idle
        Fast Verify Location
            Select-DR-Scan
            Capture-DR
            Shift-DR   (1 shift)
            Exit1-DR
            Update-DR
    END LOOP2
    Overprogram Location
        Run-Test/Idle
        Select-DR-Scan
END LOOP1

---

It will be appreciated the overprogramming step 2318 may be moved between steps 2304 and 2306. In this embodiment, the program flow would not execute the overprogram step the first time through the program flow. Additionally, in this embodiment, if another memory location were to be programmed after step 2320, the program flow would loop back to step 2306. In another embodiment, step 2314 may be executed between steps 2306 and 2310. Modifications to the pseudo-code illustrated above, can easily be derived by one skilled in the art.

As described above, the program flow illustrated in FIG. 23 uses only two instructions, namely, program/shift AR & BR and program/fast verify. The instruction codes for these two instruction are advantageously encoded to comprise the complements of one another. In one embodiment, program/shift AR & BR comprises a four-bit sequence of 0101, and program/fast verify comprises the complement four-bit sequence 1010. The program flow can thus change from one instruction to the other in only one shift (one clock cycle) by shifting in the appropriate bit into instruction register 1406. This further eliminates several shift cycles while in the Shift-IR TAP controller state. It will be appreciated that the present invention may be extended to any two instructions in a device.

In a cascaded system, a single shift may be all that is required to change between two instructions in each device under test. A single shift is possible if a pattern of alternating logic states is chosen for both instructions and the instruction register has an even number of bits. In this embodiment, one of the instructions starts with a logic one and the other instruction starts with a logic zero.

For instructions which are not encoded with bit patterns that are the complement of each other, a program flow can only change between instructions in one shift if the instructions have multiple encodings. For example, a first instruction may have the multiple encodings of 00001, 00100 and 10000 for a five-bit instruction, and a second instruction may have the multiple encodings of 00010 and 01000.

In a non-cascaded system, a single device under test which has an instruction register comprising an odd number of bits may only require a single shift to transition between two instructions. When such a device under test is incorporated into a cascaded system the multiple encoding technique is employed so that only one single shift is required to transition between two instructions (unless each device under test performs a different instruction at one given time). In an alternative embodiment, extra clock cycles may be required to ensure that each device under test has the appropriate instruction loaded into its respective instruction register.

For instructions which have only one encoding and an n-bit instruction register, the instruction codes can be assigned to allow m shifts to change from one instruction to another, and n-m shifts to change back. Thus, a total of n shifts are required to change from one instruction to the other and back again. This is a significant improvement over loading a first instruction in a first n shifts and loading a second instruction in a second n shifts. An example would be to assign 11000 and 01100 to two instructions for a 5-bit (n-bit) instruction register. In this embodiment, it requires one shift (m) to transition from 11000 to 01100, and four shifts (n-m) to shift back from 01100 to 11000. Further restrictions or additional shifts may be required when cascading devices together.

It will be appreciated that the present invention encompasses having any two programming or test instructions encoded, such that, it requires Z clock cycles or less to shift the first instruction into an instruction register having Z bits, and less than Z clock cycles to shift the second instruction into the instruction register. The number of clock cycles required to shift the second instruction into the instruction register (e.g. one clock cycle) may be less than the number of clock cycles required to load the first instruction into the instruction register. Additionally, a third instruction may be encoded, such that, it requires less than Z clock cycles to shift the third instruction into the instruction register (e.g.

one clock cycle). The number of clock cycles required to load the third instruction may be less than the number of clock cycles to load the first instruction and/or the second instruction.

Chapter six (6) of the JTAG specification requires that the two least significant instruction register bits load a fixed binary "01" pattern when controller 1403 is in the Capture-IR TAP controller state 622. In one embodiment of the present invention compatible with this requirement of the JTAG specification, the program/shift AR & BR instruction comprises a four-bit pattern of 0101, and the program/fast verify instruction comprises the complement four-bit pattern 1010. As previously described, a program flow can transition from the program/shift AR & BR instruction to the program/fast verify instruction in only one shift. However, the contents of the instruction register will change to 1001 when, for example, controller 1403 returns to the Capture-IR TAP controller state 622. Thus, to transition from the program/fast verify instruction back to the program/shift AR & BR instruction, an additional four shifts are required to load the instruction register. Therefore, a total of five (5) shifts are required to transition from the program/shift AR & BR instruction to the program/fast verify instruction and back to the program/shift AR & BR instruction.

In another embodiment of the present invention which is compatible with the JTAG specification, a first and second instruction may be encoded to require zero shifts to transition from the first instruction to the second instruction, and only one shift to transition back from the second instruction to the first instruction. In one example, two 4-bit instructions may be encoded to comprise 0000 and 0001. In this example, zero shifts are required to transition from 0000 to 0001 because this will happen automatically when controller 1403 enters the Capture-IR TAP controller state 622. It then requires only one shift to transition back from 0001 to 0000 by loading a logic zero into the most significant bit.

In another example compatible with the JTAG specification, a first 4-bit instruction may comprise 1110 and a second 4-bit instruction may comprise 1101. In this embodiment, zero shifts are required to transition from 1110 to 1101 due to the Capture-IR TAP controller state 622. It then requires only one shift to transition back from 1101 to 1110 by shifting once to the right and loading a logic one into the most significant bit. In a cascaded system, these two instruction encodings advantageously result in each device under test requiring zero shifts to transition from 1110 to 1101 due to the Capture-IR TAP controller state 622, and each device requiring only one shift to transition from 1101 back to 1110. For example, in a cascaded system having two devices under test, each device is first loaded with the first instruction comprising 1110. When the Capture-IR TAP controller state 622 is entered, each instruction will transition to 1101 in zero shifts. Shifting the instruction of each device under test once to the right will cause each instruction to transition back to 1110 (the least significant bit of the first device will be shifted into the most significant bit of the second device). This embodiment may be extended to comprise a first instruction having a format of X10 and a second instruction having a format of X01, such that, the term "X" comprises any number of logic one states. Other patterns of logic states not wholly comprising logic one states may be used for "X" if multiple encoding are utilized. In another embodiment of the present invention, which may operate in accordance with standards other than the JTAG specification, "X" may comprise logic zero states as, for example, when an instruction is shifted from right to left instead from left to right (e.g. shifting data from TDO to TDI instead of from TDI to TDO).

Multiple encodings may also be used to transition from a first instruction to a second instruction in zero shifts, and then transition back to the first instruction in one shift. For example, a first 5-bit instruction may comprise 01000 and 00100 (or 10100), and a second 5-bit instruction may comprise 01001. In this example, it requires zero shifts to transition from 01000 to 01001 due to the Capture-IR TAP controller state 622. It then requires only one shift to transition back to 00100 (or to 10100).

In another embodiment of the present invention which is compatible with the JTAG specification, a first, second and third instruction may be encoded to require a first number of shifts, or clock cycles, to load the first instruction, a second number of shifts to load the second instruction, and a third number of shifts to load the third instruction into an instruction register comprising Z bits. In this embodiment, the first number of shifts may be less than or equal to Z shifts (e.g. a default instruction requiring zero shifts after a reset signal), the second number of shifts may be zero shifts due to the Capture-IR TAP controller state 622 and the third number of shifts may be Z shifts or less. For example, a first 4-bit instruction may comprise 1000, a second 4-bit instruction may comprise 1001 and a third 4-bit instruction may comprise 0100. In this example, it requires only zero shifts to transition from 1000 to 1001 due to the Capture-IR TAP controller state 622. It then requires only one shift to transition to 0100. If the third instruction comprises 0010, then it requires only two shifts to transition to 0010.

It will be appreciated that the instruction encodings embodiments described herein may further reduce the number of clock cycles required to perform the programming flows illustrated in FIGS. 20–23.

Figure 24:
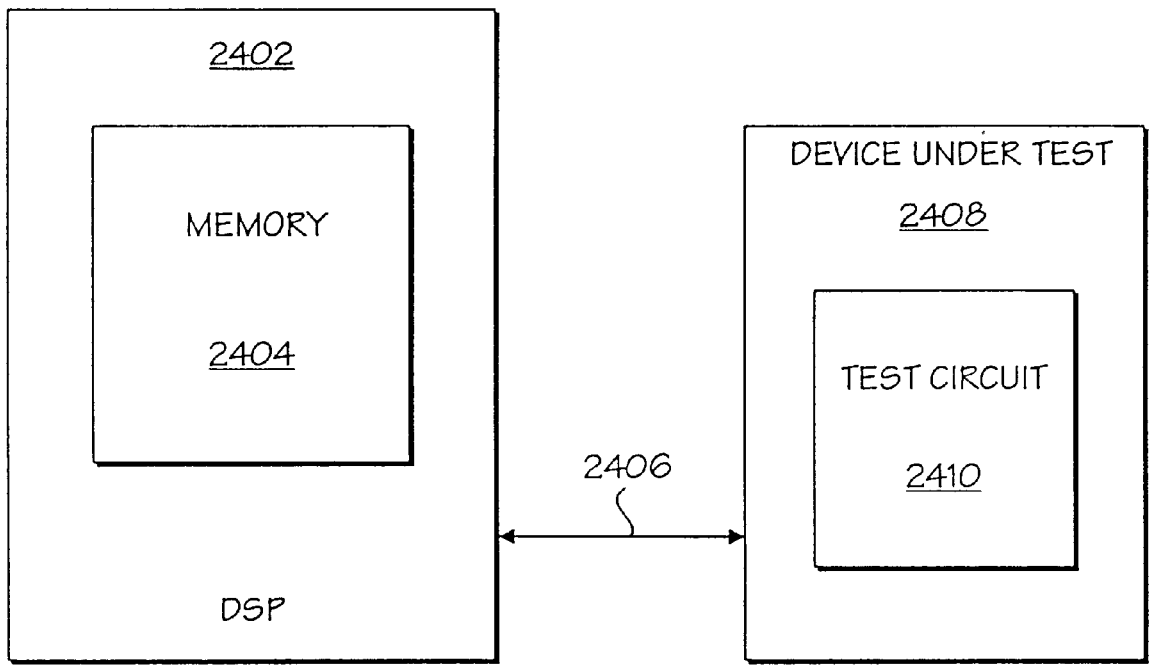
FIG. 24 illustrates a novel test circuit according to one embodiment of the present invention.

The programming flows illustrated in FIGS. 20–23 and the novel programming instructions may be stored in a medium which is readable by a digital signal processing device as illustrated in FIG. 24. FIG. 24 shows a device under test 2408 having a test circuit such as the test circuit 1100 or 1400 which communicates with a digital signal processing device 2402 having a memory 2404. In a typical scenario, the programming flows and instructions are not exercised by the end user of the programmable logic device; rather, the end user interfaces with software or a display terminal which offers the options of programming a memory location or reading from a memory location. The software or set of instructions may be stored in memory 2404 which may comprise a floppy disk, hard disk, optical disk, compact disc, embedded controller, read only memory device, or random-access memory device. Digital signal processing device 2402 may comprise a computer system, a microprocessor, or any other device capable of reading the set of novel instructions stored on medium 2402, executing the set of instructions and providing the appropriate clock, mode select and data signals to the device under test 2408 via interconnect 2406.

Figure 25:
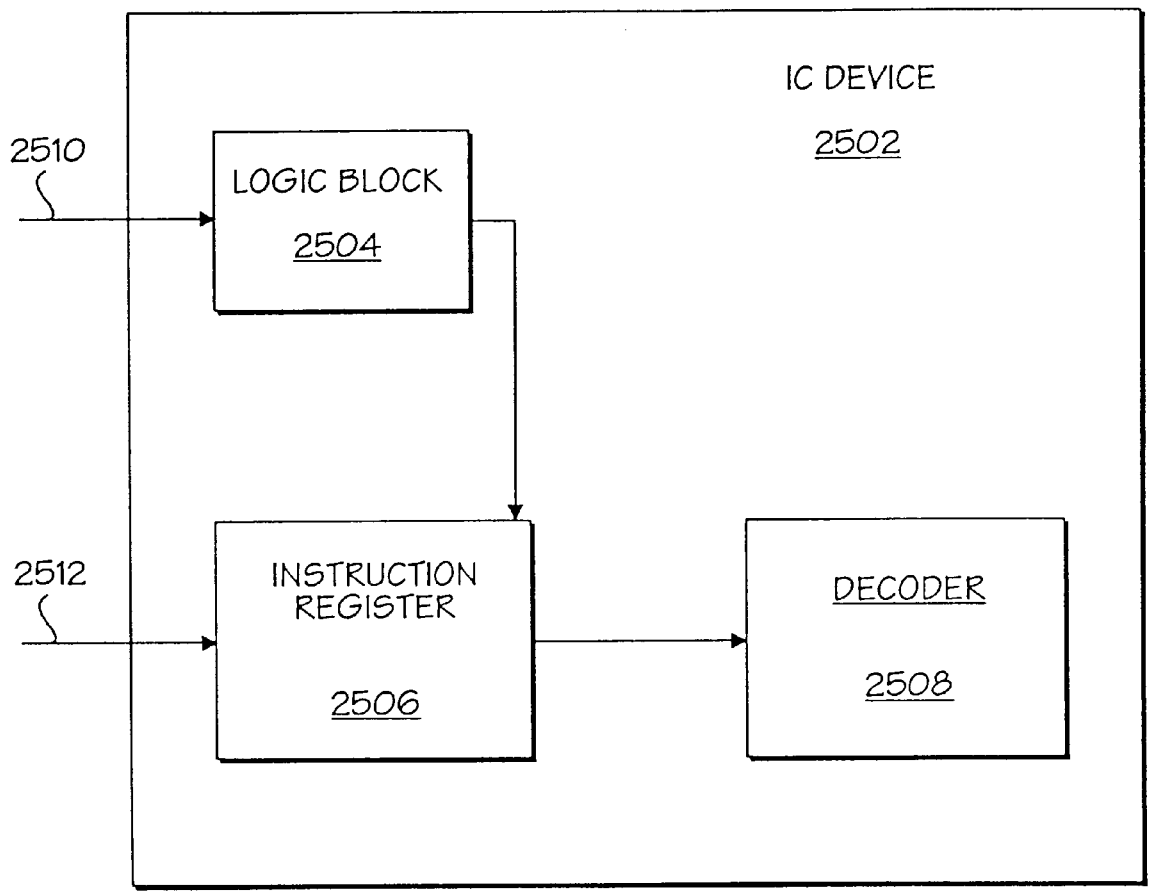
FIG. 25 illustrates another embodiment according to the present invention.

FIG. 25 illustrates another embodiment of the present invention. FIG. 25 shows an integrated circuit device 2502 which may comprise a PLD, CPLD, microprocessor or other logic device to be programmed or tested. Integrated circuit device 2502 includes an instruction register 2506 which stores programming instructions to be executed by integrated circuit device 2502. Programming instructions are provided to instruction register 2506 via bus 2512. Bus 2512 may comprise a parallel bus or a serial bus. The programming instructions stored in instruction register 2506 are decoded by decoder 2508. Instruction register 2506 is also coupled to logic block 2504 which receives an input signal at node 2510. The input signal at node 2510 may comprise a single signal or a plurality of signals. The input signal at node 2510 controls what signals are provided by logic block 2504 to instruction register 2506. The input signal at node 2510 may also be provided directly to instruction register 2506.

A first programming instruction may be loaded into instruction register 2506 from bus 2512. The first programming instruction comprises a first predetermined pattern in a first plurality of bits, for example, 01000. When an input signal is received by logic block 2504, the first programming instruction in instruction register 2506 is updated to comprise a second predetermined pattern in a second plurality of bits, for example, 00100. The input signal may comprise a clock signal which indicates that instruction register 2506 should shift its bit contents one shift to the right and shift in another predetermined bit, or may indicate that the first programming instruction should be inverted to comprise the second programming instruction. The input signal may indicate other ways of transitioning from the first programming instruction to the second programming instruction. What is significant is that the second programming instruction is determined in response to an input signal and a first predetermined pattern in a first plurality of bits in the first programming instruction.

This method for testing or programming integrated circuit device 2502 may be further extended to updating the second programming instruction stored in instruction register 2506 to provide a third programming instruction. The third programming instruction generated in response to the input signal at node 2510 and the second predetermined pattern in the second plurality of bits in the second programming instruction stored in instruction register 2506. The third programming instruction may simply comprise the first programming instruction.

Although the present invention has been described in terms of specific embodiments, it will be appreciated that various modifications and alterations might be made by those skilled in the art without departing from the spirit and scope of the invention. The invention should therefore be measured in terms of the claims which follow.

What is claimed is:

1. A method comprising:

loading into an integrated circuit device in response to a single, first instruction program data into a first data storage element and address information into an address storage element and programming in response to said first instruction said program data into a memory location having an address defined by said address information; and verifying successful programming of said integrated circuit using said program data as a verification mask within said integrated circuit.

2. The method of claim 1 wherein said verifying comprises comparing verify data read from said memory location in response to a second instruction with said program data.

3. The method of claim 2 further comprising the step of:

outputting said verify data from said integrated circuit device.

4. The method of claim 3, wherein outputting comprises serially outputting said verify data from said integrated circuit device.

5. The method of claim 2, further comprising the step of:

programming again in response to a programming instruction said program data into said memory location.

6. The method of claim 5, wherein if said program data matches said verify data then:

updating said address information or said program data; and repeating said loading, programming and verifying operations.

7. The method of claim 6, further comprising repeating said programming again operation.

8. The method of claim 5, wherein if said program data does not match said verify data then:

repeating said programming and verifying operations for a predetermined number of times or until said verify data matches said program data.

9. The method of claim 5, wherein said programming instruction requires Z clock cycles.

10. The method of claim 1, wherein loading comprises serially shifting said program data into said first data storage element, and serially shifting said address information into said address storage element.

11. The method of claim 1, wherein said integrated circuit device comprises a programmable logic device.

12. The method of claim 1, wherein:

said first data storage element comprises a first register; and said address storage element comprises a second register.

13. A method for programming an integrated circuit device comprising:

instructing in a first instructing step said integrated circuit device in one instruction to load program data, load address information and program said program data into a memory location having an address defined by said address information;

loading said program data into a first data storage element and said address information into an address storage element, wherein said program data passes through said address storage element into said first data storage element;

programming in a first programming step said program data into said memory location;

instructing in a second instructing step said integrated circuit device to read verify data from said memory location; and capturing said verify data into a second data storage element.

14. A method for programming an integrated circuit device comprising:

instructing in a first instructing step said integrated circuit device in one instruction to load program data, load address information and program said program data into a memory location having an address defined by said address information;

loading said program data into a first data storage element in said address information into an address storage element;

programming in a first programming step said program data into said memory location;

instructing in a second instructing step said integrated circuit device in one instruction to read data from said memory location and to program again said program data into said memory location; and capturing said data from said memory location into a second data storage element.

15. The method of claim 14, further comprising the step of:

comparing said verify data with said program data.

16. The method of claim 15, wherein said comparing step further comprises comparing said verify data and said program data within said integrated circuit device.

17. The method of claim 16, wherein said comparing step further comprises using said program data as a mask.

18. The method of claim 14, further comprising the steps of:

outputting said verify data from said integrated circuit device; and comparing said verify data and said program data externally to said integrated circuit device.

19. The method of claim 18, wherein said outputting step further comprises serially outputting said verify data from said integrated circuit device.

20. The method of claim 15, further comprising the step of:

programming again in a second programming step said program data into said memory location.

21. The method of claim 20, wherein if said program data matches said verify data said method further comprises the steps of:

updating said address information or said program data; and repeating said first instructing step, said loading step, said first programming step, said second instructing step, said capturing step, said comparing step and said second programming step.

22. The method of claim 20, wherein if said program data does not match said verify data said method further comprises the step of:

repeating said capturing step, said comparing step and said second programming step for a predetermined number of times or until said verify data matches said program data.

23. A method for programming an integrated circuit device comprising:

instructing in a first instructing step requiring Z clock cycles said integrated circuit device in one instruction to load program data, load address information and program said program data into a memory location having an address defined by said address information;

loading in X clock cycles said program data into a first data storage element and in Y clock cycles said address information into an address storage element;

programming in a first programming step said program data into said memory location;

instructing in a second instructing step requiring Z clock cycles said integrated circuit device to read data from said memory location; and capturing said data from said memory location into a second data storage element.

* * * * *

UNITED STATES PATENT AND TRADEMARK OFFICE
CERTIFICATE OF CORRECTION

| | |
|---|---|
| PATENT NO. | : 5,996,091 |
| APPLICATION NO. | : 08/911313 |
| DATED | : November 30, 1999 |
| INVENTOR(S) | : Christopher W. Jones et al. |

It is certified that error appears in the above-identified patent and that said Letters Patent is hereby corrected as shown below:

On Title Page, item (63) under Related U.S. Application Data, "1997" should be changed to --1996--.

Column 1, line 8, "1997" should be changed to --1996--.

Signed and Sealed this

Twenty-seventh Day of April, 2010

David J. Kappos
*Director of the United States Patent and Trademark Office*